United States Patent
Imamura

(10) Patent No.: US 7,109,653 B2
(45) Date of Patent: Sep. 19, 2006

(54) SEALING STRUCTURE WITH BARRIER MEMBRANE FOR ELECTRONIC ELEMENT, DISPLAY DEVICE, ELECTRONIC APPARATUS, AND FABRICATION METHOD FOR ELECTRONIC ELEMENT

(75) Inventor: Yoichi Imamura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 186 days.

(21) Appl. No.: 10/341,400

(22) Filed: Jan. 14, 2003

(65) Prior Publication Data

US 2003/0164674 A1    Sep. 4, 2003

(30) Foreign Application Priority Data

Jan. 15, 2002    (JP)    ............... 2002-006572

(51) Int. Cl.
*H05B 33/04*    (2006.01)
(52) U.S. Cl. .................. 313/512; 313/504; 313/506
(58) Field of Classification Search ........ 313/504–512; 428/690
See application file for complete search history.

(56) References Cited

U.S. PATENT DOCUMENTS

| | | | | |
|---|---|---|---|---|
| 3,800,177 | A | * | 3/1974 | Russ ........................... 313/500 |
| 5,189,405 | A | * | 2/1993 | Yamashita et al. .......... 313/512 |
| 6,429,584 | B1 | | 8/2002 | Kubota |
| 6,498,714 | B1 | * | 12/2002 | Fujisawa et al. ......... 361/306.3 |
| 6,573,652 | B1 | * | 6/2003 | Graff et al. ................. 313/512 |
| 6,642,651 | B1 | * | 11/2003 | Yudasaka .................... 313/504 |
| 6,710,542 | B1 | * | 3/2004 | Chun et al. ................. 313/506 |
| 6,787,249 | B1 | * | 9/2004 | Seo ............................. 428/690 |
| 2002/0047514 | A1 | * | 4/2002 | Sakurai et al. .............. 313/503 |
| 2003/0017297 | A1 | * | 1/2003 | Song et al. ................... 428/68 |
| 2003/0071569 | A1 | * | 4/2003 | Chung et al. ............... 313/512 |
| 2003/0085654 | A1 | * | 5/2003 | Hayashi ...................... 313/506 |

FOREIGN PATENT DOCUMENTS

| | | |
|---|---|---|
| CN | 1258428 A | 6/2000 |
| EP | 0 989 778 A1 | 3/2000 |
| JP | A 62-115755 | 5/1987 |
| JP | 01204431 A * | 8/1989 |
| JP | A 2-271557 | 11/1990 |
| JP | A 10-275680 | 10/1998 |
| JP | A 2000-68050 | 3/2000 |
| JP | A 2000-195675 | 7/2000 |
| JP | A 2001-68271 | 3/2001 |
| JP | A 2001-284041 | 10/2001 |
| KR | A 2001-0012686 | 2/2001 |
| WO | WO99/48339 | 9/1999 |

* cited by examiner

*Primary Examiner*—K. Guharay
*Assistant Examiner*—Sikha Roy
(74) *Attorney, Agent, or Firm*—Oliff & Berridge, PLC

(57) ABSTRACT

A sealing structure having a barrier membrane, with which the overall thickness of a display device can be reduced while ensuring sufficient barrier properties against water and oxygen so as to prevent deterioration of luminous layers. The sealing structure includes a multi-layered resin membrane for sealing an electronic element section disposed on a substrate, which is formed by alternately depositing flattening resin layers and barrier layers on the substrate. The flattening resin layers are formed inside a blocking region surrounding the electronic element section. A display device having the sealing structure, an electronic apparatus having the display device, and a fabrication method for the display device are also disclosed.

20 Claims, 19 Drawing Sheets

SEALING STRUCTURE WITH BARRIER MEMBRANE FOR ELECTRONIC ELEMENT, DISPLAY DEVICE, ELECTRONIC APPARATUS, AND FABRICATION METHOD FOR ELECTRONIC ELEMENT

BACKGROUND OF THE INVENTION

1. Field of the Invention

The present invention relates to a sealing structure for an electronic element section such as a display element, a semiconductor circuit element, etc., and more specifically, the present invention relates to a sealing structure with a barrier membrane for a display device, an electronic apparatus, and an electronic element section, as well as to a fabrication method therefor. The description of the present invention herein specifically pertains to an organic EL display device as an example of preferred applications; however, the present invention is not limited to the organic EL display device.

2. Background Art

In recent years, color display devices, which contain a plurality of display elements each of which comprises a pair of electrodes and active layers, such as a hole-injection layer/transportation layer, a luminous layer, etc., being sandwiched between the pair of electrodes, have been developed, and specifically, organic EL (electroluminescent) display devices, in which organic luminous material is used for the luminous layer, have been developed. The organic EL display device comprises active matrix circuits formed on a substrate made of, for example, glass, plastic, etc., electronic element sections formed on the active matrix circuits in a matrix pattern, and a "sealing can" for covering and sealing the electronic element section.

The "sealing can" is made of glass, metal, etc., in a box shape. The sealing structure using the "sealing can" is configured such that the "sealing can" is adhered to the periphery of the substrate using adhesive while containing the display elements therein. The "sealing can" also contains an inert gas such as nitrogen, argon, etc., in a sealed manner along with a getter substance for absorbing water and oxygen so that permeation of water and oxygen into the display elements are prevented, and the luminous layers are prevented from being deteriorated.

The overall thicknesses of conventional display devices are typically 2 to 5 mm, in which approximately 1.5 mm, at least, is occupied by the "sealing can". Because the display elements must be contained in the "sealing can" without contacting thereto, and a sufficient space for containing the getter substance or the like must be provided in the "sealing can", the thickness of the sealing structure must be increased as the sizes of the display elements increase in order to ensure sufficient strength thereof.

Moreover, because adhesive is used to adhere the "sealing can" to the substrate, a region for applying the adhesive must be occupied along the periphery of the substrate, and as a result, the size of the region for display, in which the display elements are arranged, is reduced with respect to the overall size of the display device, whereby a problem is encountered in that the exterior design of the display device is constrained when the display device is employed as a display portion of an electronic apparatus such as a portable telephone or the like. In addition, an allowable space must be occupied between the region for applying the adhesive and the region for display because the adhesive may spread out, which leads to another problem in conventional display devices in that the size of a so-called frame region, i.e., a region formed by the allowable space and the region for applying the adhesive, cannot be reduced. Furthermore, if the size of the region for applying the adhesive is reduced in order to enlarge the region for display, the barrier properties of the display device against water and oxygen may be degraded, and as a result, the luminous layers may be deteriorated (i.e., the operative lives of the luminous layers may be reduced).

Moreover, because the adhesive may not be uniformly applied to the substrate, or the adhesive may not function sufficiently, the region for applying the adhesive may not be delimited from the region for display in a manner intended, and the barrier properties of the display device may vary depending on location, which leads to a further problem in that the reliability of the display device is degraded.

Furthermore, when such a structure using a "sealing can" is employed, it is not possible to produce a top emission type display element, in which display light is emitted in the opposite direction compared with a conventional device so that a greater aperture ratio is obtainable, because the getter substance or the material forming the "sealing can" will not allow the display light to pass.

SUMMARY OF THE INVENTION

Based on the above circumstances, objects of the present invention are to provide a sealing structure with a barrier membrane for a display device, with which the thickness of the display device can be reduced while ensuring sufficient barrier properties against water and oxygen so as to prevent deterioration of luminous layers, to provide an electronic apparatus having the display device employing such a sealing structure, and to provide a fabrication method for the display device.

In order to achieve the above objects, the present invention employs the following configurations.

A sealing structure with a barrier membrane for an electronic element section formed or mounted on a substrate, according to the present invention, comprises: a multi-layered sealing membrane which is formed by overlaying at least one flattening resin layer and at least one barrier layer, and which is deposited on the electronic element section; and a closed-loop blocking region which is formed on the substrate so as to surround the entire electronic element section or a portion of the electronic element section while also surrounding the flattening resin layer.

The flattening resin layer, which is the closest to the substrate among flattening layers, may preferably be disposed so as to be adjacent to the substrate where the electronic element section is not formed.

The electronic element section may be, more specifically, an EL (electroluminescent) display element, a semiconductor circuit element, or various circuits formed on a substrate or the like.

According to the above sealing structure with a barrier membrane for an electronic element section, because the electronic element section is sealed by the multi-layered sealing membrane which is formed by overlaying at least one flattening resin layer and at least one barrier layer, the multi-layered sealing membrane can be made thinner than a "sealing can" employed in a conventional sealing structure; therefore, the overall thickness of the sealing structure can be reduced when compared with the case of the conventional sealing structure.

Moreover, because the flattening resin layer is formed, the barrier layer formed on the flattening resin layer can be made flat, and as result, a sealing structure with a thin membrane may be provided which has sufficient barrier properties, i.e., in which cracking and pin holes in the barrier layer and uneven thickness of the barrier layer can be prevented, and thus a sealing structure having a high reliability and a long operative life can be provided.

In addition, because the flattening resin layer is formed inside the blocking region, the area where the flattening resin layer is formed can be delimited by the blocking region; therefore, the size of the so-called frame region can be adjusted by the position of the blocking region. As a result, the frame region may be made narrower than that in a conventional sealing structure so as to increase the size of the display region. By delimiting the area where the flattening resin layer is formed, variation of the barrier properties depending on location can be reduced, and reliability of sealing can be improved. Furthermore, when a plurality of display elements are fabricated in the steps of making a mother substrate for fabricating a number of the display elements at a time as shown in FIG. 21, and dividing the mother substrate into the individual display elements, it is possible to prevent deposition of the sealing membrane on inscribed regions along which the mother substrate is to be cut, and as a result, degradation of the barrier properties due to damage to the sealing membrane, such as separation from the mother substrate at a cutting operation, can be prevented.

In addition, if the flattening resin layer, which is the closest to the substrate among flattening layers, is disposed so as to be adjacent to the substrate where the electronic element section is not formed, contact area between the substrate and the multi-layered sealing membrane can be increased, whereby the barrier properties of the electronic element section against water and oxygen can be further improved.

In the sealing structure with a barrier membrane for an electronic element section according to the present invention, the barrier layer may be formed so as to extend to the outside of the blocking region.

According to the above sealing structure with a barrier membrane for an electronic element section, because the barrier layer is formed so as to extend to the outside of the blocking region, a wide area where the barrier layer is formed can be ensured, whereby the barrier properties of the multi-layered sealing membrane can be further improved, and permeation of water, oxygen, or the like into the electronic element section can be more effectively prevented.

The sealing structure with a barrier membrane for an electronic element section according to the present invention may further comprise another blocking region or other blocking regions which are disposed outside the main blocking region.

According to the above sealing structure with a barrier membrane for an electronic element section, because a plurality of blocking regions are formed including another blocking region or other blocking regions which are disposed outside the main blocking region, the flattening resin layer can be reliably blocked even when the flattening resin layer is made thick, whereby the barrier properties of the multi-layered sealing membrane can be further improved. As a result, it becomes easy to form the multi-layered sealing membrane by alternately depositing the flattening resin layers and the barrier layers, and thus the barrier properties against water, oxygen, or the like can be further improved.

The sealing structure with a barrier membrane for an electronic element section according to the present invention may comprise a plurality of flattening resin layers, and each of the flattening resin layers may be formed inside one of the blocking regions.

According to the above sealing structure with a barrier membrane for an electronic element section, because each of a plurality of flattening resin layers is formed inside one of the blocking regions, the flattening resin layers can be reliably blocked by the blocking regions even when a plurality of flattening resin layers are employed, whereby the barrier properties of the multi-layered sealing membrane can be further improved.

The sealing structure with a barrier membrane for an electronic element section according to the present invention may comprise a plurality of barrier layers, and each of the barrier layers may be formed so as to extend to the outside of each of the blocking regions.

According to the above sealing structure with a barrier membrane for an electronic element section, because each of a plurality of barrier layers is formed so as to extend to the outside of each of the blocking regions, a wide area for each of the barrier layers can be ensured, whereby the barrier properties of the multi-layered sealing membrane can be further improved, and permeation of water, oxygen, or the like into the electronic element section can be more effectively prevented.

In the sealing structure with a barrier membrane for an electronic element section according to the present invention, the blocking region may be formed by a peripheral bank layer which is made of an organic material, and whose surface is made liquid-repelling.

According to the above sealing structure with a barrier membrane for an electronic element section, because the blocking region is formed by a peripheral bank layer whose surface is made liquid-repelling, the flattening resin layer cannot flow to the outside of the blocking region, whereby reliability of the sealing structure can be improved.

In the sealing structure with a barrier membrane for an electronic element section according to the present invention, the blocking region may be formed by a closed-loop liquid-repelling region extending on the substrate.

According to the above sealing structure with a barrier membrane for an electronic element section, because the blocking region is a closed-loop liquid-repelling region formed on the substrate, the flattening resin layer cannot flow to the outside of the blocking region, whereby reliability of the sealing structure can be improved.

In the sealing structure with a barrier membrane for an electronic element section according to the present invention, a liquid-affinity-treated membrane may be formed at least inside the blocking region on the substrate.

According to the above sealing structure with a barrier membrane for an electronic element section, because a liquid-affinity-treated membrane is formed inside the blocking region on the substrate, adhesion between the flattening resin layer deposited on the liquid-affinity-treated membrane and the substrate can be improved, and the barrier properties can also be improved.

In the sealing structure with a barrier membrane for an electronic element section according to the present invention, the liquid-repelling region may be formed by treating a portion of the liquid-affinity-treated membrane to make it liquid-repelling.

According to the above sealing structure with a barrier membrane for an electronic element section, because the liquid-repelling region is formed by treating a portion of the liquid-affinity-treated membrane to make it liquid-repelling, the position of the liquid-repelling region can be easily located at a predetermined position, whereby reliability of the sealing structure can be improved.

Next, a display device according to the present invention comprises: a display element formed or mounted on a substrate; a closed-loop blocking region which is formed on the substrate so as to surround the entire display element or a portion of the display element; and a multi-layered sealing membrane which is formed by depositing at least one flattening resin layer and at least one barrier layer on the display element, wherein the flattening resin layer is formed inside the blocking region.

According to the above display device, because the display element is sealed by the multi-layered sealing membrane which is formed by depositing at least one flattening resin layer and at least one barrier layer, the multi-layered sealing membrane can be made thinner than a "sealing can" employed in a conventional sealing structure; therefore, the overall thickness of the display element can be reduced when compared with the case of the conventional display element.

Moreover, because the flattening resin layer is formed, the barrier layer formed on the flattening resin layer can be made flat, and as result, a display element having sufficient barrier properties, i.e., in which cracking and pin holes in the barrier layer can be prevented, may be provided.

In addition, because the flattening resin layer is formed inside the blocking region, the area where the flattening resin layer is formed can be delimited by the blocking region; therefore, the size of the so-called frame region can be adjusted by the position of the blocking region. As a result, the frame region may be made narrower than that in a conventional sealing structure so as to increase the size of the display region. By delimiting the area where the flattening resin layer is formed, variation of the barrier properties depending on location can be reduced, and reliability of sealing can be improved.

In addition, if the flattening resin layer, which is the closest to the substrate among flattening layers, is disposed so as to be adjacent to the substrate where the electronic element section is not formed, contact area between the substrate and the multi-layered sealing membrane can be increased, whereby the barrier properties of the display element against water and oxygen can be further-improved.

In the display device according to the present invention, the barrier layer may be formed so as to extend to the outside of the blocking region.

According to the above display device, because the barrier layer is formed so as to extend to the outside of the blocking region, the barrier layer having a wider area can be provided, whereby the barrier properties can be further improved, and permeation of water, oxygen, or the like into the display element can be more effectively prevented.

The display device according to the present invention may further comprise another blocking region or other blocking regions which are disposed outside the main blocking region.

According to the above display device, because a plurality of blocking regions are formed including another blocking region or other blocking regions which are disposed outside the main blocking region, the flattening resin layer can be reliably blocked even when the flattening resin layer is deposited thickly, whereby the barrier properties of the multi-layered sealing membrane can be further improved. As a result, it becomes easy to form the multi-layered sealing membrane by alternately depositing the flattening resin layers and the barrier layers, and thus the barrier properties against water, oxygen, or the like can be further improved.

The display device according to the present invention may comprise a plurality of flattening resin layers, and each of the flattening resin layers may be formed inside one of the blocking regions.

According to the above display device, because each of a plurality of flattening resin layers is formed inside one of the blocking regions, the flattening resin layers can be reliably blocked by the blocking regions even when a plurality of flattening resin layers are employed, whereby the barrier properties of the multi-layered sealing membrane can be further improved.

The display device according to the present invention may comprise a plurality of barrier layers, and each of the barrier layers may be formed so as to extend to the outside of each of the blocking regions.

According to the above display device, because each of a plurality of barrier layers is formed so as to extend to the outside of each of the blocking regions, a wide area for each of the barrier layers can be ensured, whereby the barrier properties of the multi-layered sealing membrane can be further improved, and permeation of water, oxygen, or the like into the display element can be more effectively prevented.

In the display device according to the present invention, the blocking region may be formed by a peripheral bank layer which is made of an organic material, and whose surface is made liquid-repelling.

According to the above display device, because the blocking region is formed by a peripheral bank layer whose surface is made liquid-repelling, the flattening resin layer cannot flow to the outside of the blocking region, whereby reliability of the sealing structure can be improved.

In the display device according to the present invention, the blocking region may be formed by a closed-loop liquid-repelling region extending on the substrate.

According to the above display device, because the blocking region is a closed-loop liquid-repelling region formed on the substrate, the flattening resin layer cannot flow to the outside of the blocking region, whereby reliability of the sealing structure can be improved.

In the display device according to the present invention, a liquid-affinity-treated membrane may be formed at least inside the blocking region on the substrate.

According to the above display device, because a liquid-affinity-treated membrane is formed inside the blocking region on the substrate, adhesion between the flattening resin layer deposited on the liquid-affinity-treated membrane and the substrate can be improved, and the barrier properties can also be improved.

In the display device according to the present invention, the liquid-repelling region may be formed by treating a portion of a liquid-affinity-treated membrane to make it liquid-repelling.

According to the above display device, because the liquid-repelling region is formed by treating a portion of the liquid-affinity-treated membrane to make it liquid-repelling, the position of the liquid-repelling region can be easily located at a predetermined position, whereby reliability of the display element can be improved.

In the display device according to the present invention, the display element may preferably comprise a plurality of light emitting elements, and banks delimiting the light emitting elements, and each of the light emitting elements may comprise an electrode, an active layer disposed adjacent to the electrode, and an opposing electrode disposed adjacent to the active layer.

The display device according to the present invention may further comprise a drive circuit for driving the display elements, and the drive circuit may be encapsulated by at least one flattening resin layer and at least one barrier layer.

According to the above display device, because the drive circuit is encapsulated by at least one flattening resin layer and at least one barrier layer, permeation of water, oxygen, or the like into the drive circuit can be prevented, whereby reliability of the display element can be further improved.

An electronic apparatus according to the present invention may comprise any one of the display devices according to the present invention.

According to the above electronic apparatus, because the electronic apparatus comprises any of the display devices described above, the overall thickness of the electronic apparatus can be made thinner while ensuring reliability against permeation of water, oxygen, or the like.

Next, a method, according to the present invention, for fabricating a display device, which includes an electronic element section formed on a substrate, may comprise the steps of: forming a closed-loop blocking region on the substrate so as to surround the entire electronic element section or a portion of the electronic element section; coating a resin coating substance containing a resin monomer or a resin oligomer inside the blocking region; polymerizing the resin coating substance after coating so as to form a flattening resin layer; and forming a barrier layer so as to cover at least the flattening resin layer and the blocking region.

The electronic element section may be an EL (electroluminescent) display element, a semiconductor circuit element, or various circuits formed on a substrate or the like.

According to the above method for fabricating a display device, because the closed-loop blocking region is formed on the substrate, and a resin coating substance is coated on the inside of the blocking region, the flow of the resin coating substance is restrained by the blocking region, whereby a sealing area can be freely defined, and thus a display device can be fabricated in which the barrier properties are substantially uniform at any location on the substrate.

In addition, because the barrier layer is formed after the flattening resin layer is made, cracking and pin holes in the barrier layer can be prevented, whereby the barrier properties against water and oxygen can be improved.

In the method, according to the present invention, for fabricating a display device, the step of forming the flattening resin layer and the step of forming the barrier layer may be alternately repeated a plurality of times so as to form a multi-layered sealing membrane in which the flattening resin layers and the barrier layers are overlaid alternately.

According to the above method for fabricating a display device, because the edges of the multi-layered sealing membrane can be formed in such a manner that the edges of the flattening resin layers and the barrier layers, which are alternately deposited, are aligned with respect to each other, the anti-permeation performance of the edges of the multi-layered sealing membrane against water and oxygen can be improved, and display devices having sufficient barrier properties can be fabricated.

BRIEF DESCRIPTION OF THE DRAWINGS

FIG. 13 is another process drawing illustrating a method for fabricating the display device according to the first embodiment of the present invention.

DETAILED DESCRIPTION OF THE PREFERRED EMBODIMENTS

First Embodiment

Figure 1:
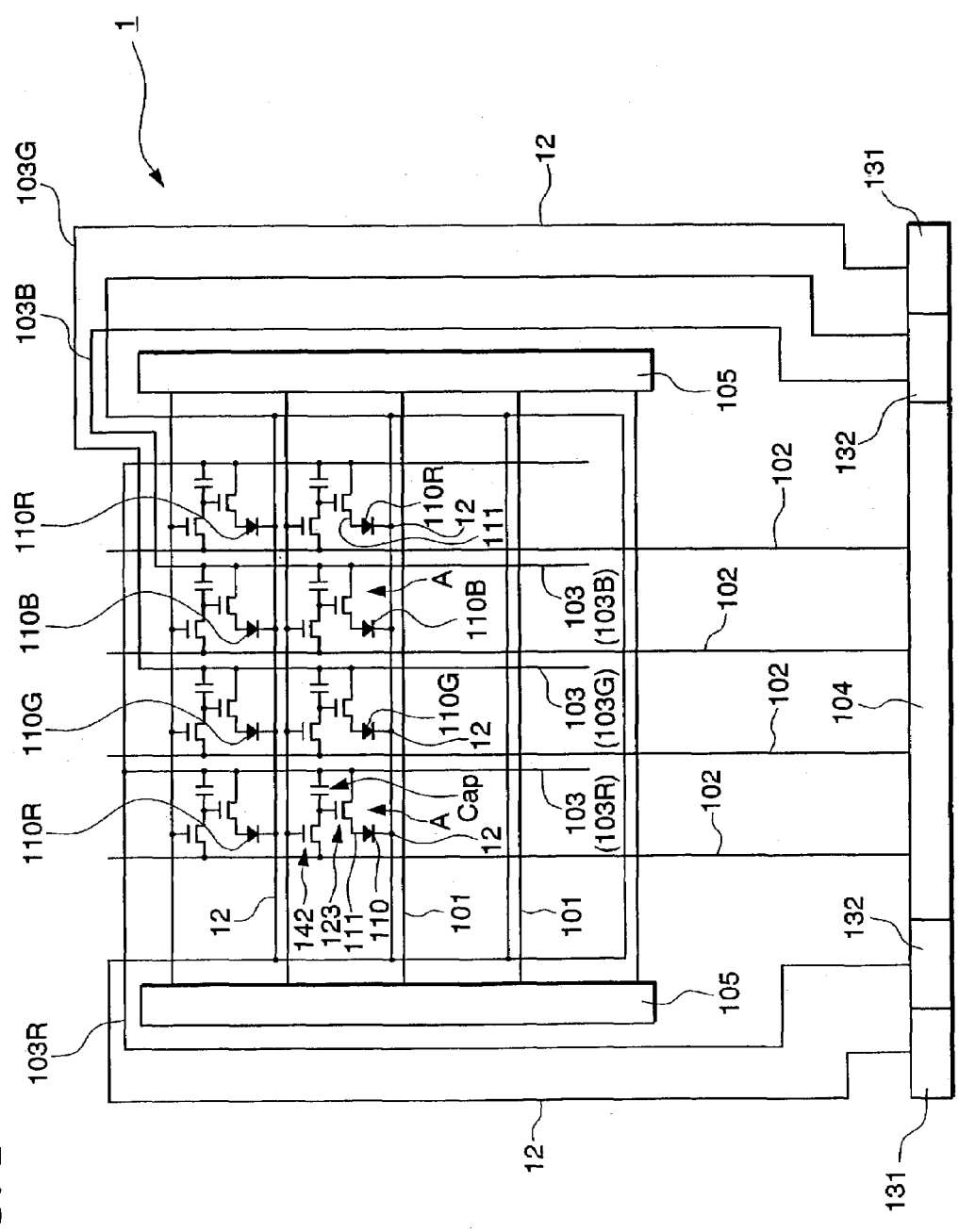
FIG. 1 is a schematic plan view showing the wiring configuration of a display device according to a first embodiment of the present invention.

An example as a first embodiment of the present invention, in which display elements for an organic EL display device (a display device) are applied to an electronic element section, will be explained below with reference to the drawings. This embodiment is merely an example of the present invention, and the present invention is not limited to this embodiment to which various modifications may be made within the scope of the present invention. In the drawings to which, hereinafter, reference is made, scale factors for various layers and various elements may be differently set in order to facilitate understanding of the various layers and various elements in the drawings.

FIG. 1 is a schematic plan view showing the wiring configuration of a display device (an organic EL display device) according to the first embodiment of the present invention. The display device 1 shown in FIG. 1 is an organic EL display device of an active matrix type in which thin film transistors (TFTs) are employed as direct drive elements.

The display device 1 shown in FIG. 1 comprises scanning lines 101, signal lines 102 which extend perpendicularly to the scanning lines 101, source lines for luminance 103 which extend in parallel to the signal lines 102, and pixels A, each provided in the vicinity of each of the intersecting points of the scanning lines 101 and the signal lines 102.

A data side drive circuit 104, which comprises a shift register, a level shifter, and video lines, is connected to each of the signal lines 102. Scanning line drive circuits 105, which comprise a shift register and a level shifter, are connected to each of the scanning lines 101.

Moreover, to each of the pixels A, a switching TFT 142 whose gate electrode is provided with scanning signals via the scanning lines 101, a retaining capacitor Cap for retaining image signals provided from the signal lines 102 via the switching TFT 142, a current TFT 123 whose gate electrode is provided with the image signals retained by the retaining capacitor Cap, a pixel electrode (a first electrode) 111 to which drive current is supplied from the source lines for luminance 103 when the pixel electrode 111 is electrically connected to the source lines for luminance 103, an active layer 110 sandwiched between the pixel electrode 111 and a cathode electrode 12 (a second electrode), are provided. The cathode electrode 12 is connected to a source circuit for cathode 131.

Furthermore, the active layer 110 includes a luminescent layer comprising a hole-injection/transportation layer and an organic electroluminescent layer formed so as to be adjacent to the hole-injection/transportation layer. The luminescent layer comprises three kinds of luminescent layers, i.e., a luminescent layer 110R emitting red light, a luminescent layer 110G emitting green light, and a luminescent layer 110B emitting blue light, which are arranged in a stripe pattern.

In addition, the source lines for luminance 103R, 103G, and 103B, which are connected to the luminescent layers 110R, 110G and 110B via the current TFT 123, respectively, are connected to source circuits for luminance 132. The source lines for luminance 103R, 103G, and 103B are respectively provided for colors because the drive voltages should be differently set depending on colors, i.e., depending on the luminescent layers 110R, 110G, and 110B.

In the display device 1, when the switching TFT 142 is turned on by the drive of the scanning lines 101, electrical potential in the signal lines 102 at the time is retained in the retaining capacitor Cap, and the current TFT 123 is turned on or off depending on the state of the retaining capacitor Cap. Drive currents flow from the source lines for luminance 103R, 103G, and 103B to the pixel electrode 111 via the channels of the current TFT 123, and electrical currents flow to the cathode electrode (second electrode) via the luminescent layers 110R, 110G, and 110B. Each of the active layers 110 emits light depending on the magnitude of electrical current flowing therethrough.

Figure 2:
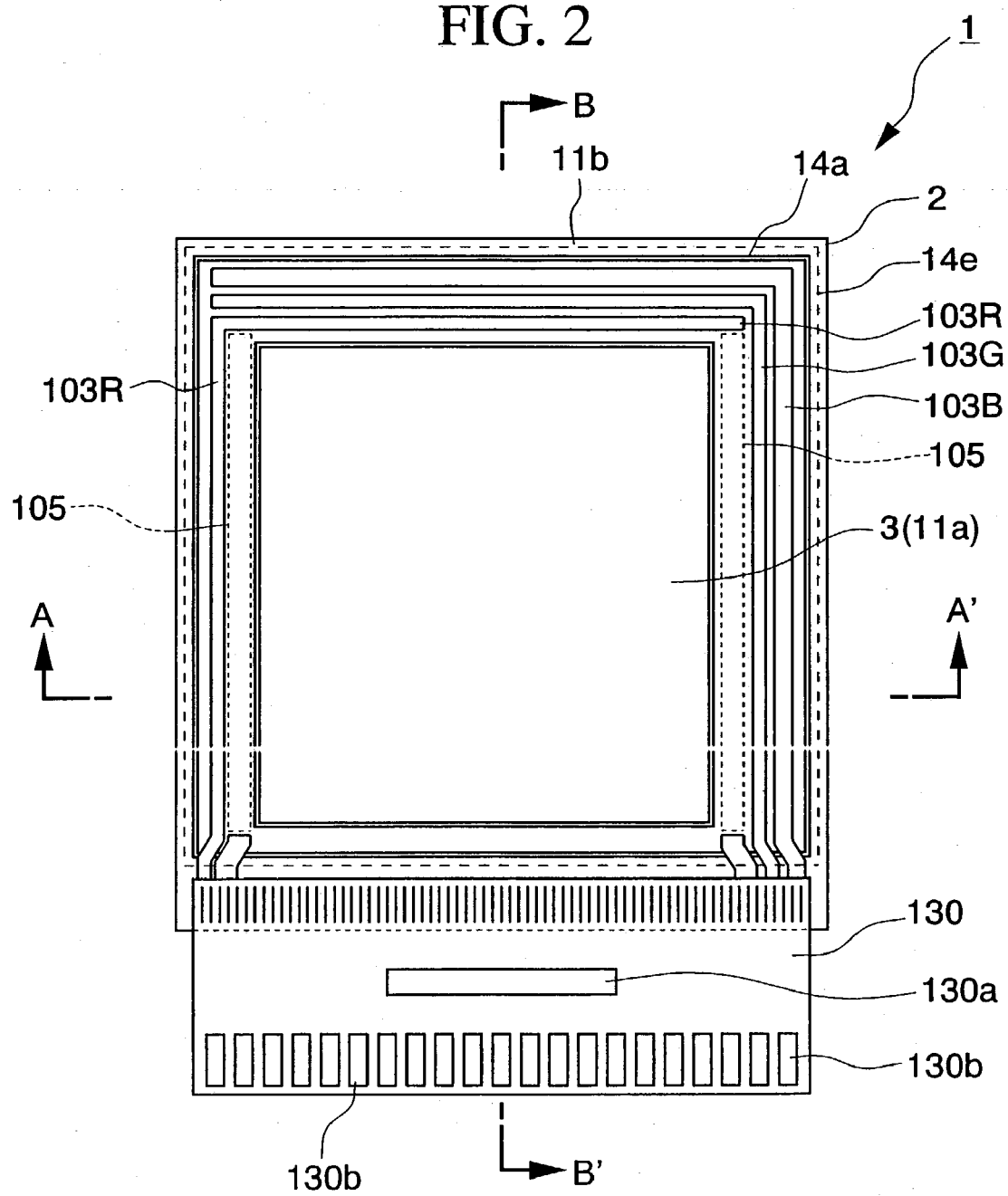
FIG. 2 is a schematic plan view showing the display device according to the first embodiment of the present invention.

Next, the specific configurations of the display device 1 according to the present embodiment will be explained with reference to FIGS. 2 to 4. FIG. 2 is a schematic plan view showing the display device according to the present embodiment, FIG. 3 is a cross-sectional view taken along the line A–A' in FIG. 2, and FIG. 4 is a cross-sectional view taken along the line B–B' in FIG. 2.

Figure 3:
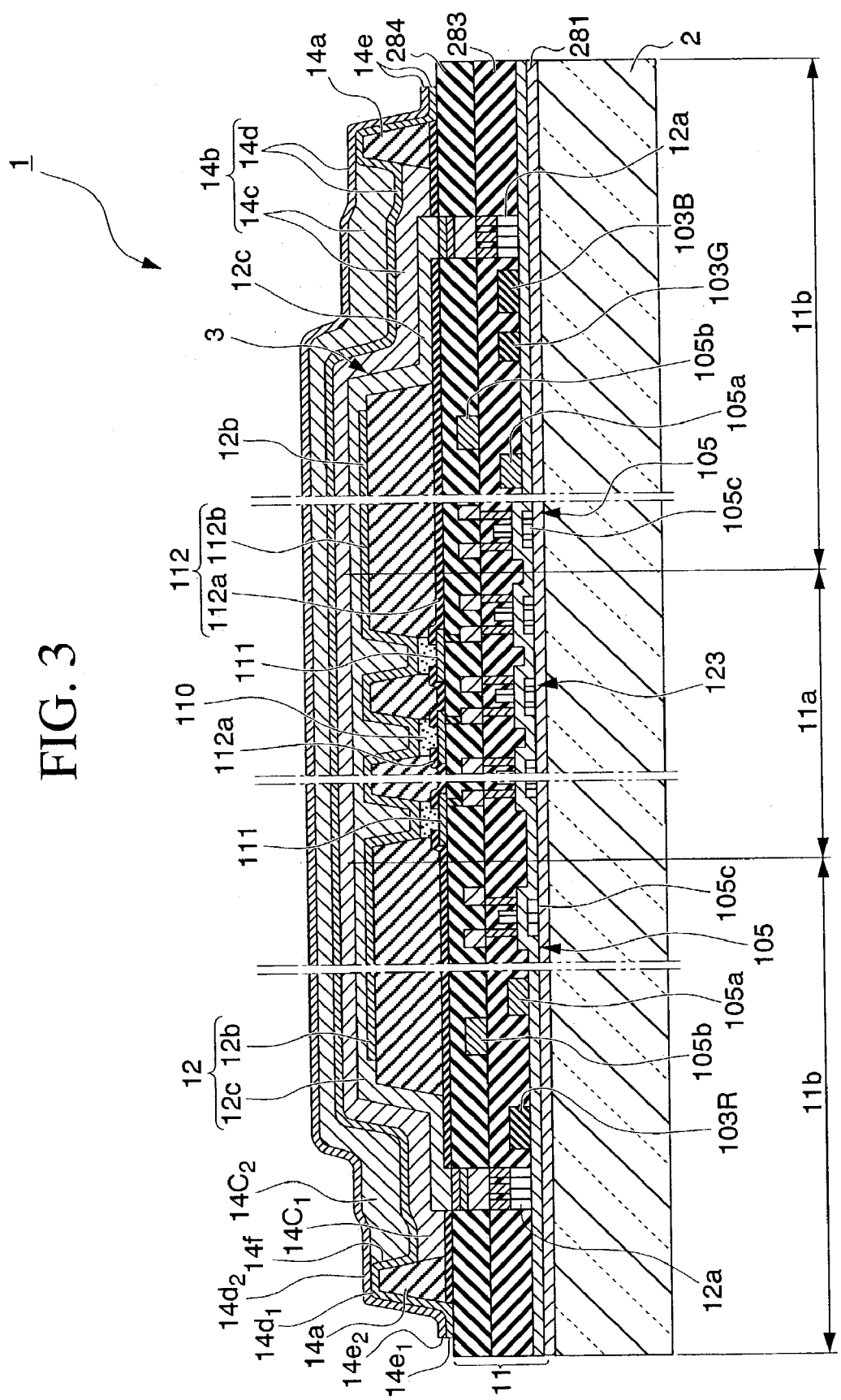
FIG. 3 is a cross-sectional view taken along the line A–A' in FIG. 2.
Figure 4:
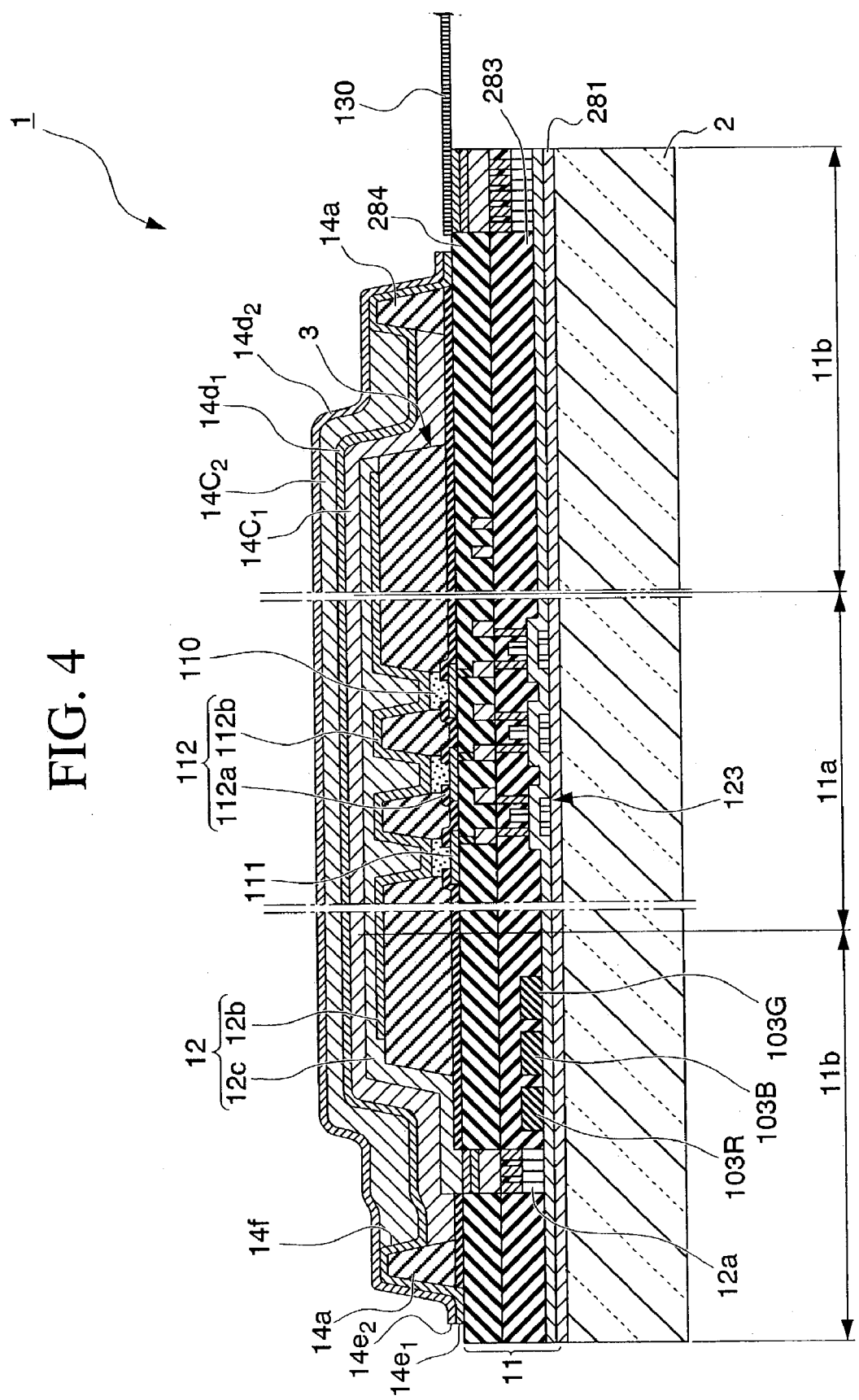
FIG. 4 is a cross-sectional view taken along the line B–B' in FIG. 2.

As shown in FIGS. 2, 3, and 4, in the display device 1 according to the present embodiment, a display section 11a, in which the pixel electrodes (electrodes) connected to the current TFT (not shown) are arranged in a matrix pattern, and a non-display section 11b disposed around the display section 11a, are provided on a transparent substrate 2 made of glass, plastic, or the like. The non-display section 11b comprises the source lines for luminance 103 (103R, 103G, and 103B) respectively connected to the pixel electrodes, and the scanning line drive circuits 105. In the display section 11a, there is provided a display element section (an electronic element section) 3 having a substantially rectangular shape in a plan view.

As shown in FIG. 2, the source lines for luminance 103R, 103G, and 103B provided in the non-display section 11b extend from the bottom of the substrate 2, as viewed in FIG. 2, toward the top along the scanning line drive circuits 105, turn to the left at the end of the scanning line drive circuits 105, extend along the edge of the display element section 3, and then are connected to the pixel electrodes (not shown) provided in the display element section 3.

In addition, as shown in FIGS. 2 and 4, a flexible tape 130, whose base is made of polyimide or polyester, and on which control IC 130a is packaged, is adhered to an end of the substrate 2. The control IC 130a comprises therein the data side drive circuit 104, the source circuit for cathode 131, and the source circuits for luminance 132 shown in FIG. 1. There are provided a plurality of external terminals 130b on the flexible tape 130, which extend from the control IC 130a, and which are arranged along a side of the flexible tape 130.

Next, as shown in FIGS. 3 and 4, there is formed a circuit section 11 on the substrate 2, and the display element section 3 is formed on the circuit section 11. The display section 11a is disposed in the middle of the circuit section 11. In a portion of the circuit section 11 that is contained in the display section 11a, there are provided the current TFTs 123, and the pixel electrodes 111 connected to the current TFTs 123. The current TFTs 123 are embedded between a substrate protective layer 281 and a second interlayer insulation layer 283 and first interlayer insulation layer 284. The pixel electrodes are formed on the first interlayer insulation layer 284. In the circuit section 11, there are also provided the retaining capacitor Cap and the switching TFT 142; however, these are not shown in FIGS. 3 and 4.

There are provided banks 112 between the pixel electrodes 111. The bank 112 comprises an inorganic bank layer 112a formed on the first interlayer insulation layer 284, and an organic bank layer 112b formed on the inorganic bank layer 112*a*. The inorganic bank layer 112*a* is formed so as to cover not only the display section 11*a*, but also the non-display section, substantially. The surface of the inorganic bank layer 112*a* is made to have liquid-affinity, while on the other hand, the surface of the organic bank layer 112*b* is made liquid-repelling. Moreover, the active layer 110 is formed on each of the pixel electrodes 111, and the cathode electrode 12 is formed on the active layers 110 and organic bank layers 112*b*. The inorganic bank layer 112*a* and organic bank layer 112*b* are formed so as to partially overlap with the pixel electrode 111, and more specifically, the inorganic bank layer 112*a* extends closer to the middle of the pixel electrode 111 than the organic bank layer 112*b*. Note that a shading layer may be provided between the inorganic bank layer 112*a* and the organic bank layer 112*b*.

The organic bank layer 112*b* is made of an ordinary resist such as acrylic resin, polyimide resin, or the like. The thickness of the organic bank layer 112*b* is preferably set to be 0.1 to 3.5 µm, and more preferably, is set to be approximately 2 µm. If the thickness thereof is less than 0.1 µm, the thickness of the organic bank layer 112*b* may be less than the total thickness of the hole-injection/transportation layer and of the luminescent layer, and as a result, the luminescent layer, in a liquid state, may overflow beyond an upper opening 112*d*, which is not preferable. On the other hand, if the thickness thereof is greater than 3.5 µm, the step due to the upper opening 112*d* may be too large, and as a result, a step coverage of the cathode electrode 12 formed on the organic bank layer 112*b* may not be sufficiently ensured, which is also not preferable. The thickness of the organic bank layer 112*b* may be set to be greater than 2 µm, which is more preferable because electrical insulation performance between the cathode electrode 12 and the pixel electrode 111 can be enhanced.

There are provided sections made to have liquid-affinity and sections made liquid-repelling on and around the banks 112. The sections made to have liquid-affinity include the inorganic bank layers 112*a* and the pixel electrodes 111, into which liquid-affinitive group such as hydroxyl group are infiltrated by a plasma treatment using oxygen as a reaction gas. The sections made liquid-repelling include the organic bank layers 112*b*, into which liquid-repelling group such as fluorine are infiltrated by a plasma treatment using tetrafluoromethane as a reaction gas.

As shown in FIGS. 3 and 4, the active layers 110 are deposited on the pixel electrodes 111, respectively. The banks 112 are respectively provided between the pixel electrodes 111, and between the active layers 110 so as to divide the active layers 110. Each of the active layers 110 comprises the hole-injection/transportation layer (not shown) deposited on the pixel electrode 111, and the luminescent layer (not shown) formed adjacent to the hole-injection/transportation layer. In the luminescent layer, holes injected from the hole-injection/transportation layer and electrons emitted from the cathode electrode are combined to emit luminous light. The luminescent layer includes three kinds of luminescent layers, i.e., a red luminescent layer 110R emitting red light, a green luminescent layer 110G emitting green light, and a blue luminescent layer 110B emitting blue light, which are arranged, for example, in a stripe pattern. Note that the luminescent layers are not necessarily arranged in a stripe pattern, but may be arranged in a mosaic pattern, or in a deltaic pattern.

The cathode 12 comprises a first cathode layer 12*b* made of lithium fluoride and calcium layered product, and a second cathode layer 12*c* made of Al (aluminum), Ag (silver), or Mg/Ag (magnesium/silver) layered product. The first cathode layer 12*b* is provided merely on the organic bank layers 112*b*, while on the other hand, the second cathode layer 12*c* is formed on the organic bank layers 112*b*, as well as on the non-display section 11*b*, and is connected to a cathode line 12*a*. The cathode electrode 12, as the opposing electrode of the pixel electrode 111, functions to supply electricity to the active layer 110.

Next, as shown in FIGS. 2 and 3, there are provided scanning drive circuits 105 in the non-display section disposed in either sides of the display element section 3. The scanning drive circuit 105 comprises an N-channel type or a P-channel type TFT 105*c* forming an inverter included in the shift register. The TFT 105*c* has substantially the same structure as that of the current TFT 123 except for not being connected to the pixel electrode 111.

As shown in FIG. 3, there are formed signal lines 105*a* for a scanning circuit on portions of the substrate protective layer 281 that are located in the vicinity of the scanning drive circuits 105. In addition, there are provided source lines 105*b* for a scanning circuit on portions of the second interlayer insulation layer 283 that are located in the vicinity of the signal lines 105*a* for a scanning circuit.

Moreover, as shown in FIG. 3, there are provided the source lines for luminance 103R, 103G, and 103B in the vicinity of the source lines 105*b* for a scanning circuit.

Furthermore, as shown in FIG. 3, the cathode line 12*a*, which is connected to the cathode electrode 12, is formed in portion of the non-display section 11*b* that are located outwardly relative to the source lines for luminance 103R, 103G, and 103B. The cathode line 12*a* is formed substantially in a U-shape in plan view so as to surround the source lines for luminance 103R, 103G, and 103B.

Next, a sealing structure for the display device 1 of the present embodiment will be explained.

As shown in FIGS. 2, 3, and 4, there is formed a closed-loop peripheral bank layer 14*a* (a blocking region) on the substrate 2 and around the display element section 3. As shown in FIGS. 3 and 4, a multi-layered sealing membrane 14*b* is deposited on the display element section 3. The multi-layered sealing membrane 14*b* is formed by alternately depositing two flattening resin layers 14*c* (i.e., 14*c*1 and 14*c*2) and two barrier layers 14*d* (i.e., 14*d*1 and 14*d*2). The flattening resin layers 14*c*1 and 14*c*2 are formed inside the closed-loop peripheral bank layer 14*a* while being blocked by the peripheral bank layer 14*a*. The barrier layers 14*d*1 and 14*d*2 are formed on the flattening resin layers 14*c*1 and 14*c*2 (in an area inside the peripheral bank layer 14*a*), and the edge portions 14*e* (i.e., 14*e*1 and 14*e*2) thereof extend over the peripheral bank layer 14*a*. The number of layers of the flattening resin layers 14*c* and of the barrier layers 14*d* may be freely selected to be one or more; however, two to four is preferred.

The thickness of the peripheral bank layer 14*a* is set to be 1 to 3 µm, and the surface of the peripheral bank layer 14*a* is made liquid-repelling as in the case of the organic bank layer 112*b*.

The flattening resin layers 14*c* are made of, for example, polyacrylic resin or the like. The flattening resin layers 14*c* are formed to flatten the surface of the display device 1 by filling the step (e.g., 1 to 3 µm) between the non-display section 11*b* and the display section 11*a* (i.e., between the inorganic bank layer 112*a* formed in the non-display section 11*b* and the display element section 3), and functions to make the step coverage of the barrier layers 14*d* formed on the flattening resin layers 14*c* as small as possible so that cracking and pin holes in the barrier layers 14*d* and uneven thickness of the barrier layers 14*d* can be prevented. The barrier layers 14d are made of an inorganic membrane such as $SiO_2$, and are superior in blocking water and oxygen. The multi-layered sealing membrane 14b is formed by overlaying the flattening resin layers 14c and the barrier layers 14d, and functions to prevent degradation of the cathode electrode 12 and the active layer 110 by inhibiting permeation of water, oxygen, impurity ions, or the like into the display element section 3.

The sealing structure will be more specifically explained. As shown in FIGS. 3 and 4, the lowermost flattening resin layer 14c1 among the flattening resin layer 14c is formed on the inorganic bank layer 112a (liquid-affinitive membrane) in the non-display section 11b and on the display element section 3 while being blocked by the inner side of the peripheral bank layer 14a. The flattening resin layer 14c1 is formed to be thinner than the peripheral bank layer 14a. Because the surface of the inorganic bank layer 112a is made to have liquid-affinity, the flattening resin layer 14c1 made of polyacrylic resin or the like is easily settled on the inorganic bank layer 112a, and thus adhesion between the inorganic bank layer 112a and the flattening resin layer 14c1 is sufficiently ensured. On the other hand, because the surface of the peripheral bank layer 14a is made liquid-repelling, the peripheral bank layer 14a does not accept the flattening resin layer 14c1, and as a result, the flattening resin layer 14c1 is reliably blocked by the peripheral bank layer 14a.

Next, the barrier layer 14d1 is formed on the flattening resin layer 14c1. The barrier layer 14d1 is formed so as to cover the peripheral bank layer 14a, and extends over the peripheral bank layer 14a to the outside of the peripheral bank layer 14a so that the edge portion 14e1 of the barrier layer 14d1 is located on the first interlayer insulation layer 284. In the vicinity of the peripheral bank layer 14a, a step 14f is formed due to the thickness difference between the flattening resin layer 14c1 and the peripheral bank layer 14a. The barrier layer 14d1 extends over the step 144f to the outside of the peripheral bank layer 14a.

Moreover, another flattening resin layer 14c2 is formed on the barrier layer 14d1. The flattening resin layer 14c2 is blocked by the step 14f between the peripheral bank layer 14a and the flattening resin layer 14c1 while being disposed inside the peripheral bank layer 14a. As shown in FIGS. 3 and 4, the level of the upper surface of the flattening resin layer 14c2 is set to substantially coincide with the level of the upper surface of the peripheral bank layer 14a in this embodiment; however, the level of the upper surface of the flattening resin layer 14c2 may be set to be lower than the level of the upper surface of the peripheral bank layer 14a.

Furthermore, another barrier layer 14d2 is formed on the flattening resin layer 14c2. The barrier layer 14d2 is formed so as to cover the peripheral bank layer 14a as in the case of the barrier layer 14d1, and extends over the peripheral bank layer 14a to the outside of the peripheral bank layer 14a so that the edge portion 14e2 of the barrier layer 14d2 is located on the first interlayer insulation layer 284. Because the flattening resin layer 14c2 under the barrier layer 14d2 is blocked by the inner surface of the peripheral bank layer 14a, the barrier layers 14d1 and 14d2 directly contact each other at the outside of the peripheral bank layer 14a.

As mentioned above, the peripheral bank layer 14a is made of a resist having thermal resistance and solvent resistance, such as acrylic resin, polyimide resin, or the like, and is made liquid-repelling. The thickness of the peripheral bank layer 14a is preferably set to be 0.1 to 3.5 μm, and more preferably, is set to approximately 2 μm. If the thickness thereof is less than 0.1 μm, the flattening resin layer 14c cannot be blocked, which is not preferable. On the other hand, if the thickness thereof is greater than 3.5 μm, fabrication may become unstable due to a large ratio of sectional form, which is also not preferable.

Both of the flattening resin layers 14c1 and 14c2 are made of acrylic resin. The thicknesses of the flattening resin layers 14c1 and 14c2 are preferably set to be 0.05 to 3 μm, and more preferably, are set to be approximately 0.1 to 1 μm. If the thicknesses thereof are less than 0.05 μm, the flatness thereof may be degraded, which is not preferable. On the other hand, if the thicknesses thereof are greater than 3 μm, the flattening resin layer 14c may be deposited over the peripheral bank layer 14a, which is also not preferable. The thicknesses of the flattening resin layers 14c1 and 14c2 may be set to be either the same or different with respect to each other.

Furthermore, the barrier layers 14d1 and 14d2 are made of $SiO_2$, $Al_2O_3$, or the like. The thicknesses of the barrier layers 14d1 and 14d2 are preferably set to be 5 to 500 nm, and more preferably, are set to be approximately 30 to 300 nm. If the thicknesses thereof are less than 5 nm, permeation of water and oxygen may not be prevented, which is not preferable. On the other hand, if the thicknesses thereof are greater than 500 nm, the barrier layers 14d1 and 14d2 may easily have cracking due to thermal stress or mechanical stress, which is also not preferable. The thicknesses of the barrier layers 14d1 and 14d2 may be set to be either the same or different with respect to each other.

By employing the above configurations, the thickness of the multi-layered sealing structure 14b may be set to be 1 to 3 μm. In addition, the thickness of the sealing structure in the display device and above the first interlayer insulation layer 284 may be set to be 1 to 3 μm.

By employing the above sealing structure, the multi-layered sealing structure 14b may be formed to be thin, and thus the overall thickness of the display device 1 can be made much less than that of a display device in which a conventional "sealing can" is employed. Because the flattening resin layers 14c are provided, the barrier layers 14d formed on the flattening resin layers 14c can be made flat, and as a result, cracking and pin holes in the barrier layers 14d can be prevented, whereby a sealing membrane having excellent barrier properties can be provided.

In addition, because the flattening resin layers 14c are formed inside the peripheral bank layer 14a, the area where the flattening resin layers 14c are formed can be delimited by the peripheral bank layer 14a; therefore, the size of the so-called frame region can be adjusted by the position of the peripheral bank layer 14a. As a result, the frame region may be made narrower than that in a conventional sealing structure so as to increase the size of the display section 11a. By delimiting the area where the flattening resin layer 14c is formed, variation of the barrier properties depending on location can be reduced, and reliability of sealing can be improved.

Moreover, if the flattening resin layer 14c1, which is the closest to the substrate 2 among flattening layers, is disposed so as to be adjacent to the substrate 2 in the non-display section 11b where the display element section 3 is not formed, contact area between the substrate 2 and the multi-layered sealing membrane 14b can be increased, whereby the barrier properties of the electronic element section at the membrane boundaries against water and oxygen can be further improved.

Next, a method for fabricating the electronic element section according to the present embodiment will be explained using the appended drawings while referring to the display device shown in FIGS. 1 to 4 as an example. The method for fabricating a display device comprises the steps of forming a closed-loop blocking region on the substrate 2, coating a resin coating substance containing a resin monomer or a resin oligomer inside the blocking region, polymerizing the resin coating substance after coating so as to form a flattening resin layer, and forming a barrier layer so as to cover at least the flattening resin layer and the blocking region. In the above method, the step of forming the flattening resin layer and the step of forming the barrier layer is alternately repeated a plurality of times so as to form a multi-layered sealing membrane in which the flattening resin layers and the barrier layers are overlaid alternately.

The methods for fabricating the display element section 3 (electronic element section) on the circuit 11 on the substrate 2, and for fabricating the sealing structure for sealing the display element section 3 will be explained below with reference to FIGS. 5 to 12. The cross sections shown in FIGS. 5 to 12 are taken along the line A—A' in FIG 2.

Figure 5:
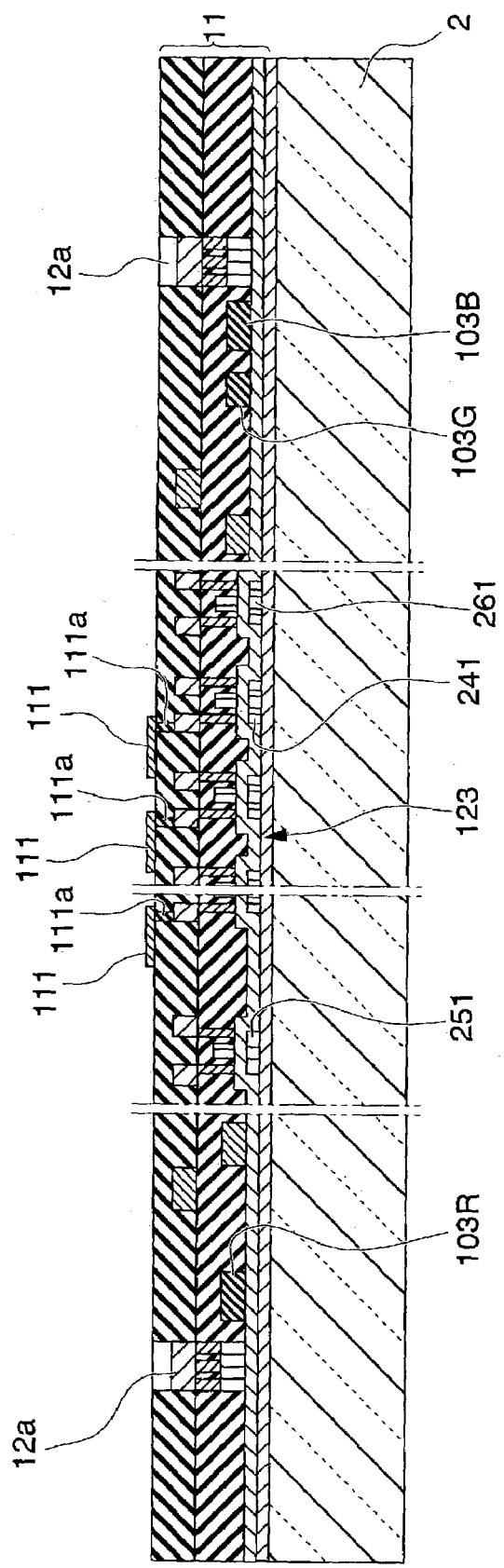
FIG. 5 is a process drawing illustrating a method for fabricating the display device according to the first embodiment of the present invention.

As shown in FIG. 5, the circuit 11 is formed on the substrate 2, and then a membrane made of transparent electrode material such as ITO (Indium Tin Oxide) is formed so as to cover the circuit 11, and after that, the pixel electrodes 111 are formed on the first interlayer insulation layer 284 by applying a patterning process to the membrane. The pixel electrodes 111 are formed only in an area where the current TFTs 123 are formed, and are connected to the current TFTs 123 via contact holes 111a.

Figure 6:
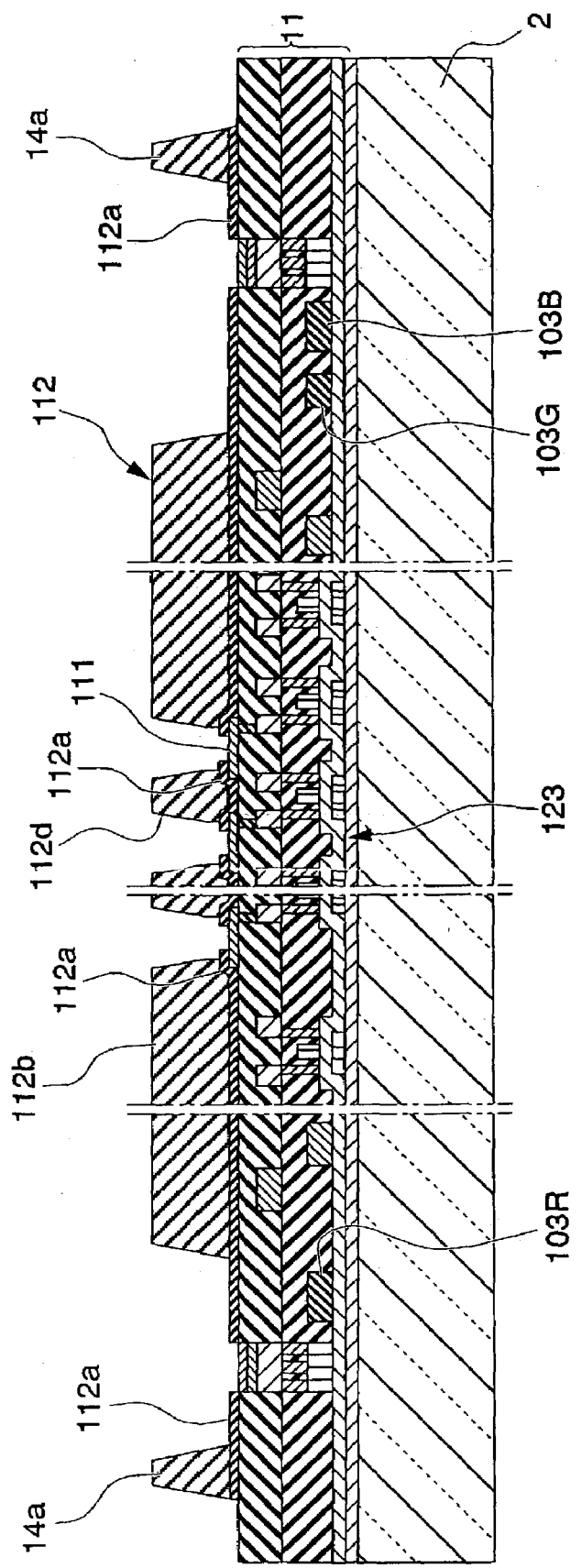
FIG. 6 is another process drawing illustrating a method for fabricating the display device according to the first embodiment of the present invention.

Next, as shown in FIG. 6, the inorganic bank layers 112a are formed on the first interlayer insulation layer 284 and pixel electrodes 111. The inorganic bank layers 112a are formed so as to expose portions of the pixel electrode 111, respectively. The inorganic bank layers 112a are formed not only in the display section 11a, but also in the non-display section on the substrate 2. The inorganic bank layers 112a are formed by executing the steps of forming an inorganic membrane made of such as $SiO_2$, $TiO_2$, SiN on the entire surfaces of the first interlayer insulation layer 284 and pixel electrodes 111 using, for example, a CVD process, a TEOS process, a sputtering process, a vapor deposition process, or the like, and applying a patterning process to the inorganic membrane.

Moreover, as shown in FIG. 6, the organic bank layers 112b are formed on the inorganic bank layers 112a. The organic bank layers 112b are formed so as to expose portions of the pixel electrode 111 through the inorganic bank layers 112a, respectively. In this manner, the banks 112 are formed on the first interlayer insulation layer 284.

Furthermore, in the step of forming the blocking region, the peripheral bank layer 14a is formed on the inorganic bank layers 112a in the non-display section 11b simultaneously with the forming process of the organic bank layers 112b.

Next, regions exhibiting liquid-affinity and regions exhibiting liquid-repellency are formed on the surface of the banks 112. In this embodiment, both regions are made using plasma treatment processes. In particular, the plasma treatment processes include a liquid-affinitive process in which the pixel electrode 111 and the inorganic bank layers 112a are made to have liquid-affinity, and a liquid-repelling process in which the organic bank layers 112b and the peripheral bank layer 14a are made liquid-repelling.

Figure 7:
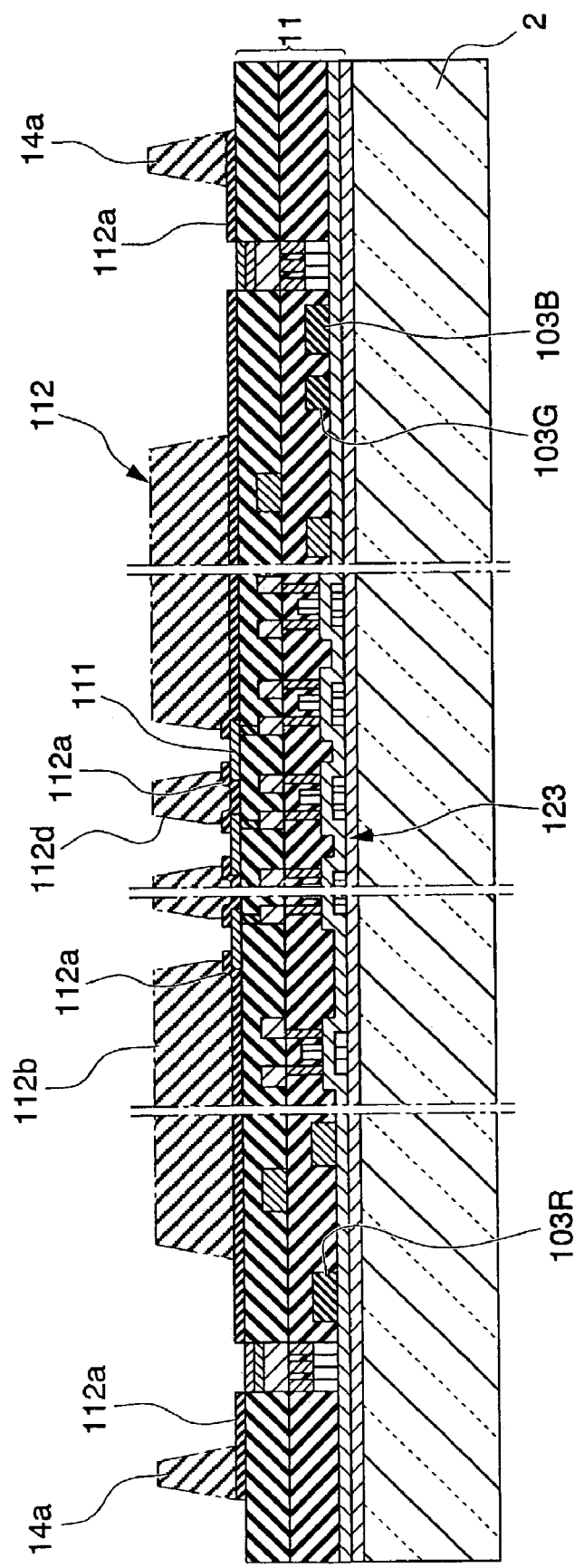
FIG. 7 is another process drawing illustrating a method for fabricating the display device according to the first embodiment of the present invention.

More specifically, the banks 112 are heated to a predetermined temperature (e.g., 70 to 80° C.), and then a plasma treatment ($O_2$ plasma treatment) as the liquid-affinitive process, in which oxygen is used as a reaction gas, is applied to the banks 112 under atmospheric conditions. Next, another plasma treatment ($CF_4$ plasma treatment) as the liquid-repelling process, in which tetrafluoromethane is used as a reaction gas, is applied to the banks 112 under atmospheric conditions, and then the banks 112, which have been heated for the plasma treatments, are cooled to room temperature to obtain the regions exhibiting liquid-preference and the regions exhibiting liquid-repellency. In FIG. 7, the contours of the pixel electrode 111 and the inorganic bank layers 112a, which are made to have liquid-affinity, are shown by solid lines, and the contours of the organic bank layers 112b and the peripheral bank layer 14a, which are made liquid-repelling, are shown by alternate long and short dash lines.

Figure 8:
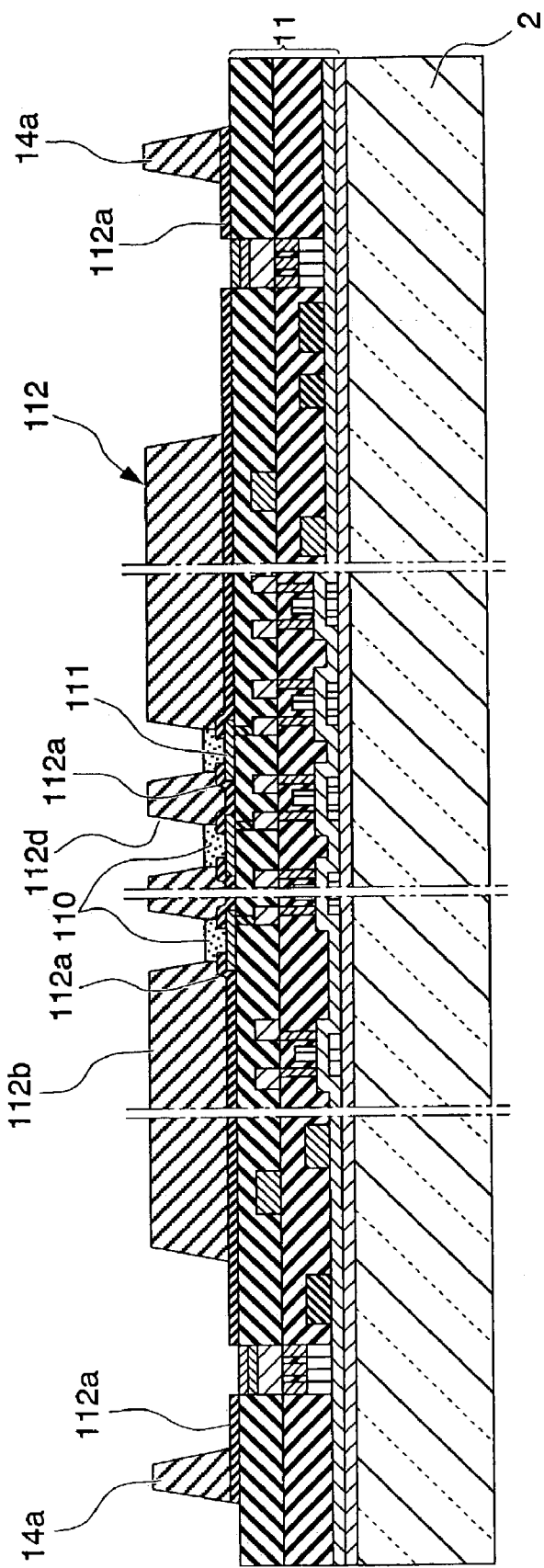
FIG. 8 is another process drawing illustrating a method for fabricating the display device according to the first embodiment of the present invention.

Next, as shown in FIG. 8, the active layers 110 are formed on the pixel electrodes 111 using an ink-jet method. The active layers 110 are formed through the steps of ejecting and drying a composite ink containing material for the hole-injection/transportation layer, and ejecting and drying another composite ink containing material for the luminescent layer.

Figure 9:
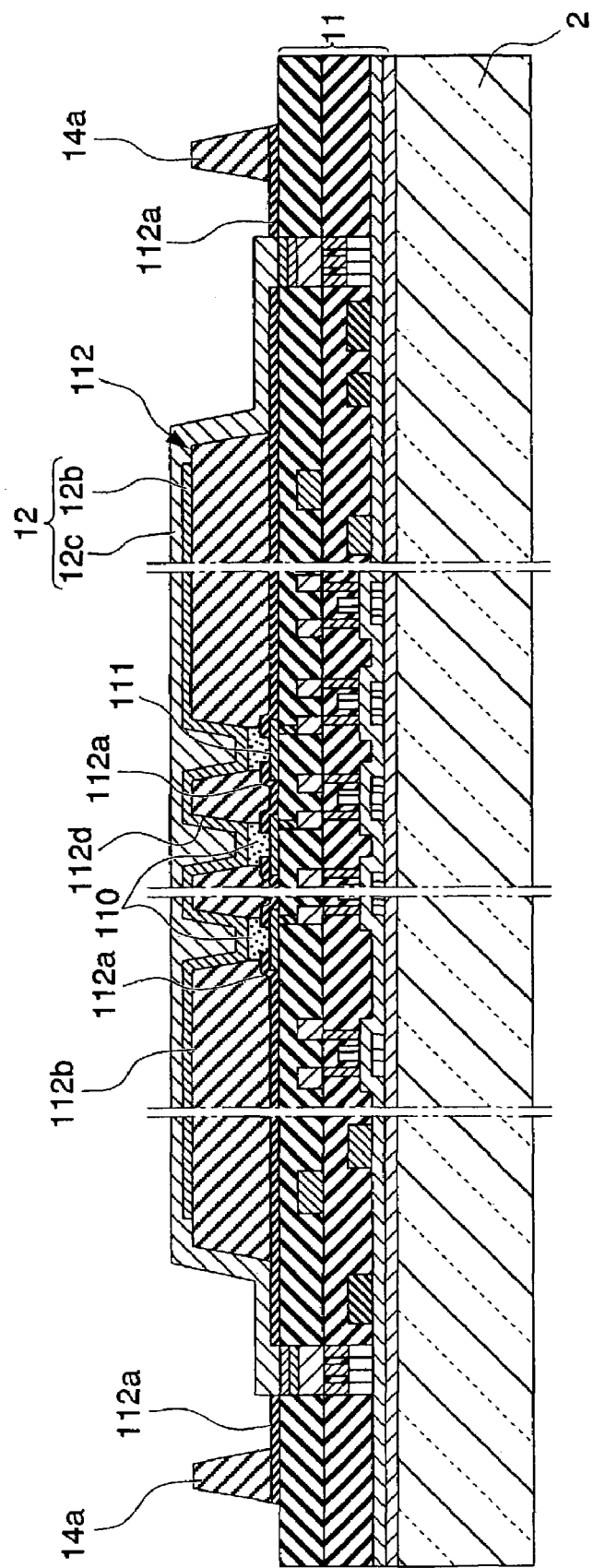
FIG. 9 is another process drawing illustrating a method for fabricating the display device according to the first embodiment of the present invention.

Next, as shown in FIG. 9, the cathode electrode 12, which covers the banks 112 and the active layers 110, is formed. The cathode electrode 12 can be obtained through the steps of forming the first cathode layer 12b on the banks 112 and the active layers 110, and forming the second cathode layer 12c which covers the first cathode layer 12b, and which is to be connected to the cathode line 12a disposed on the substrate 2.

Figure 10:
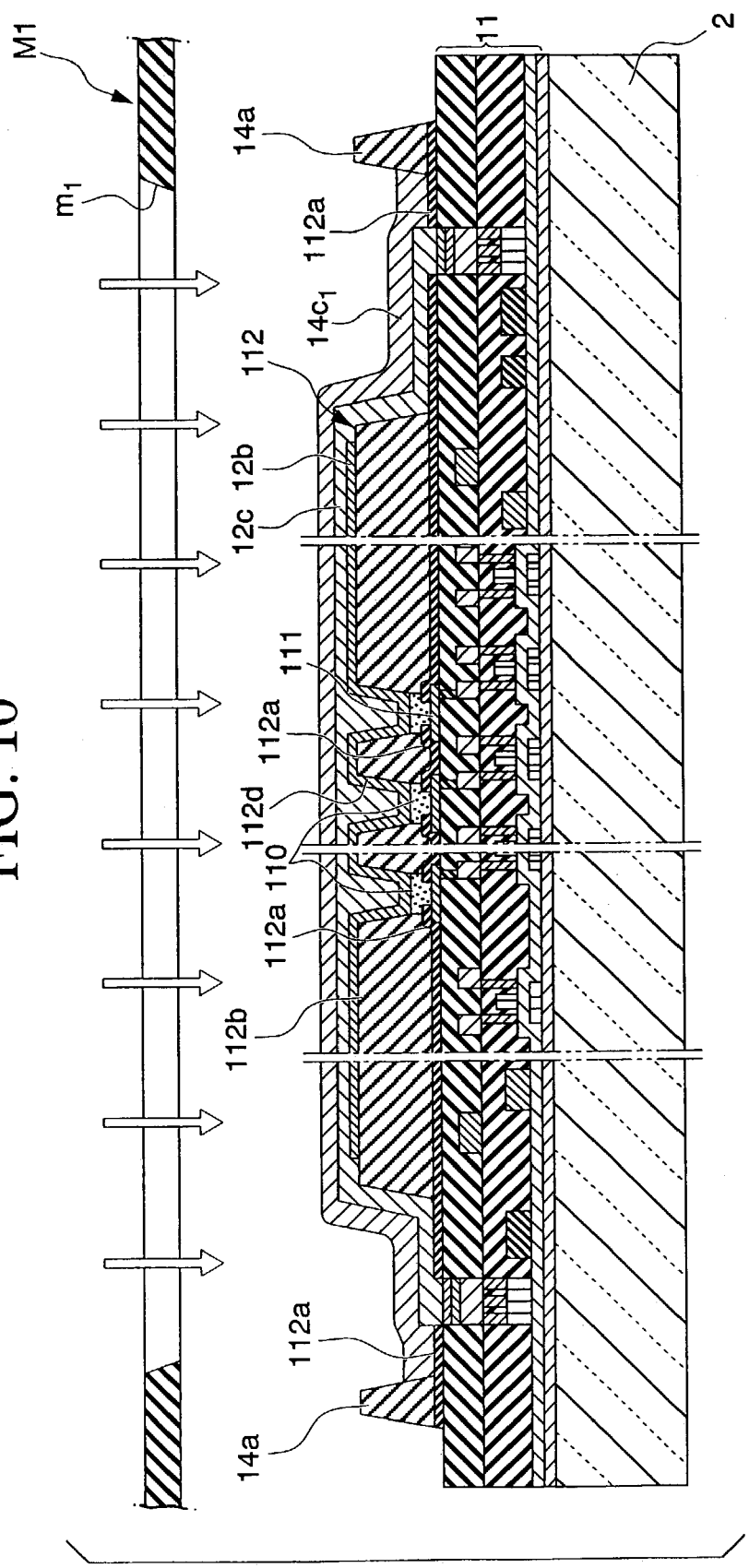
FIG. 10 is another process drawing illustrating a method for fabricating the display device according to the first embodiment of the present invention.

Next, as shown in FIG. 10, as the steps for fabricating the flattening resin layer, a resin coating substance containing a resin monomer or a resin oligomer, or an organic silicide (e.g., TEOS (tetraethylorthosilicate), $Si_3N_4$) is heated and vaporized under vacuum conditions, the vaporized substance is sprayed on the inorganic bank layer 112b, which is disposed on the display element section 3 and in the non-display section, and inside the peripheral bank layer 14a, and ultraviolet light is emitted on the sprayed substance under vacuum conditions using an ultraviolet lamp, such as a mercury lamp, a metal halide lamp, or the like, so as to polymerize the resin monomer or the resin oligomer contained in the resin coating substance, and so as to form the flattening resin layer 14c 1. When the resin coating substance is sprayed, a mask M1 having an opening m1 is disposed above the substrate 2 while being positioned so that the opening m1 is aligned with the inside portion of the peripheral bank layer 14a formed on the substrate 2, and the resin coating substance is preferably sprayed through the opening m1. By using the mask M1, the resin coating substance is prevented from being deposited outside the peripheral bank layer 14a. Plasma radiation may be used to polymerize the resin monomer or the resin oligomer.

The resin coating substance exhibits a viscosity less than 500 cP, and preferably less than 100 cP, at room temperature, which means that the resin coating substance has substantial flowability; however, because the resin coating substance after being sprayed is blocked by the peripheral bank layer 14a, the resin coating substance cannot flow to the outside of the peripheral bank layer 14a. In this manner, the flattening resin layer 14c1 is formed inside the peripheral bank layer 14a. Note that the thickness of the flattening resin layer 14c1 can be adjusted by the amount of the sprayed resin, and the thickness thereof is preferably set to be 0.1 to 1 μm.

The resin coating substance in this embodiment comprises: a primary constituent, i.e., a resin constituent, which may be selected from vinyl resin monomers such as acrylic resin monomer, methacrylic resin monomer, polyester resin monomer, PET resin monomer, polypropylene resin monomer, or the like, or from vinyl resin oligomers such as acrylic resin oligomer, methacrylic resin oligomer, polyester resin oligomer, PET resin oligomer, polypropylene resin oligomer, or the like; and a secondary constituent consisting of a photopolymerization intiator. More specifically, the primary constituent may be selected from acrylic resin monomers or acrylic resin oligomers having a polymerizable double bond, such as alkyd resin, polyester acrylate, polyether acrylate, acrylic acrylate, urethane acrylate, epoxy acrylate, silicone acrylate, polyacetal acrylate, polybutadiene acrylates, melamine acrylate, or the like. Moreover, the resin monomer or resin oligomer may be selected from various compounds such as monofunctional compounds, bifunctional compounds, trifunctional compounds, and multifunctional compounds, depending on the number of acryloyl group being contained. Two or more acrylic resin monomers or acrylic resin oligomers may be mixed for use. In addition, the molecular weight of the acrylic resin monomer or acrylic resin oligomer to be used is preferably less than 10,000, is more preferably less than 2,000, and is more preferably from 100 to 600.

The photopolymerization intiator as the secondary constituent may be selected from benzoin ethers, benzophenones, xanthones, and acetophenone derivatives. The amount of the photopolymerization intiator may preferably be 0.01 to 10 pats by weight, and more preferably 0.1 to 2 pats by weight when the amount of the acrylic resin monomer or acrylic resin oligomer as the primary constituent is 100 pats by weight.

The resin coating substance in this embodiment may be prepared by mixing the primary constituent consisting of acrylic resin monomer or acrylic resin oligomer and the secondary constituent consisting of a photopolymerization intiator. The viscosity of the resin coating substance is preferably set to be less than 500 cP, and more preferably set to be less than 100 cP at room temperature, so that irregularity in the display section may be reliably flattened.

Figure 11:
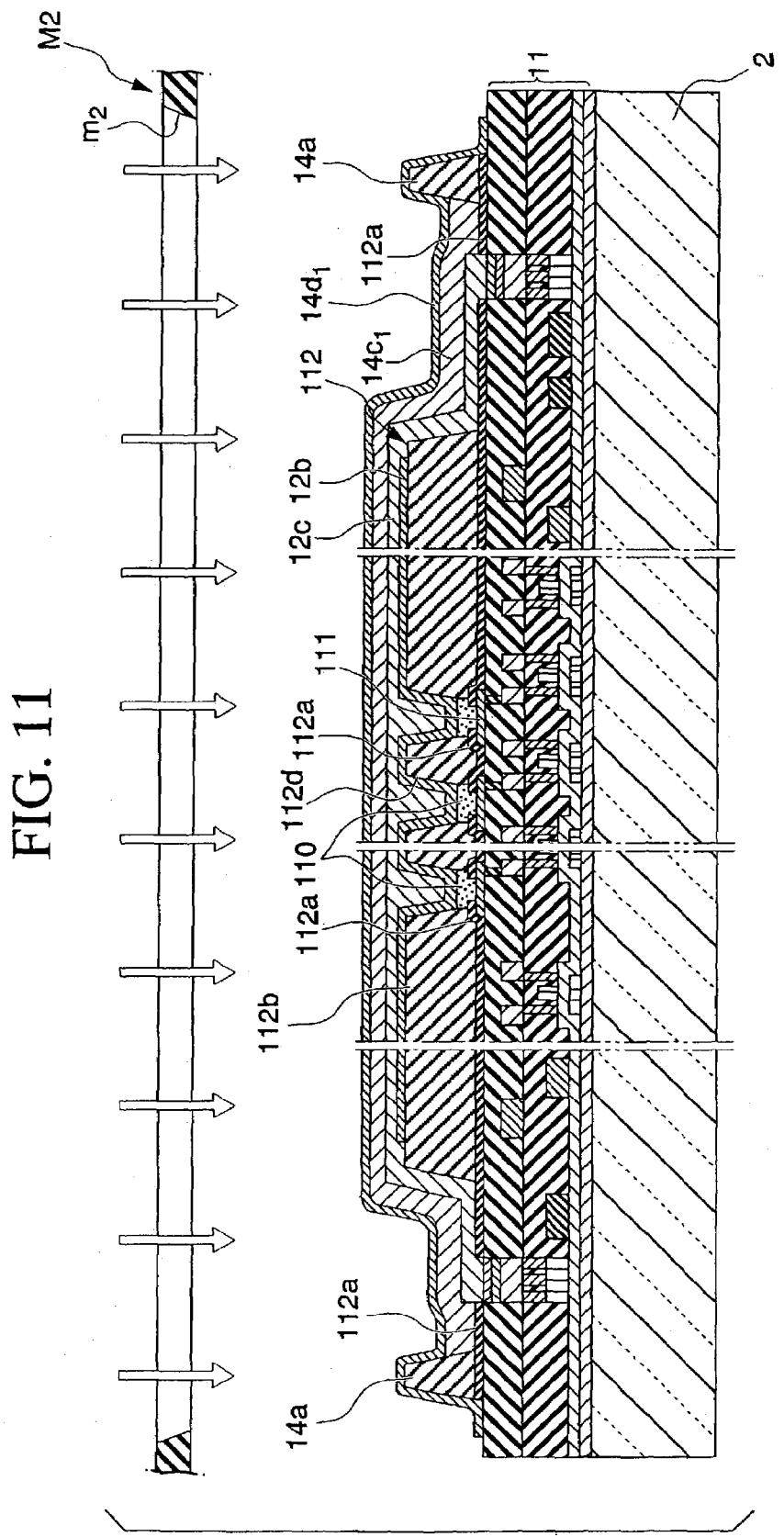
FIG. 11 is another process drawing illustrating a method for fabricating the display device according to the first embodiment of the present invention.

Next, as shown in FIG. 11, as the step for fabricating the barrier layer, the barrier layer 14d1 is formed on the flattening resin layer 14c1 using a vapor deposition process. The barrier layer 14d1 may be formed using metal such as aluminum, silicon, magnesium, titanium, indium, tin, or metal oxide ($SiO_2$, $Al_2O_3$), or the like, as a vapor deposition material. The vapor deposition process may be selected from a vacuum vapor deposition process, a sputtering process, an ion plating process, or the like.

When the vapor deposition process is performed, another mask M2 having an opening m2 is preferably disposed above the substrate 2 while being positioned so that the peripheral portion of the opening m2 is aligned with the outside peripheral portion of the peripheral bank layer 14a formed on the substrate 2, and vaporized substance is preferably applied and deposited through the opening m2. By using the mask M2, the barrier layer 14d1 is prevented from being formed on the side edges of the substrate 2. The thickness of the barrier layer 14d1 is preferably set to be 5 to 500 nm.

Because the barrier layer 14d1 can be made substantially flat due to the flattening resin layer 14c1, the barrier layer 14d1, which is dense without having defects such as pin holes or cracking, can be obtained.

Moreover, because the barrier layer 14d1 is formed on the flattening resin layer 14c1, adhesion between the flattening resin layer 14c1 and the barrier layer 14d1 is improved due to an anchor effect of the flattening resin layer 14c1, and the barrier properties against water and oxygen can be improved.

Figure 12:
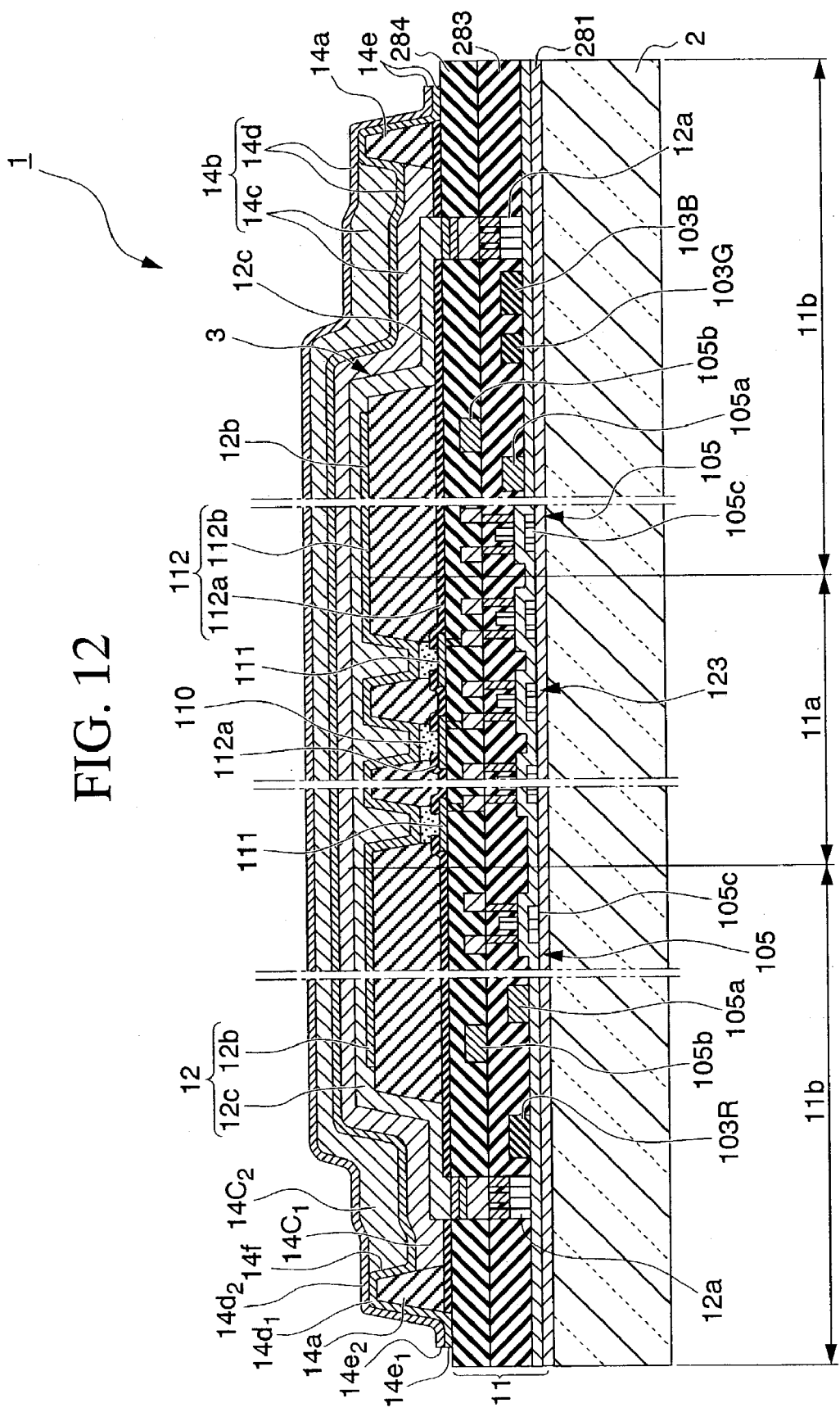
FIG. 12 is another process drawing illustrating a method for fabricating the display device according to the first embodiment of the present invention.

Next, as shown in FIG. 12, by repeating the above-mentioned flattening resin layer forming step and the barrier layer forming step, the flattening resin layer 14c2 and the barrier layer 14d2 are sequentially formed on the barrier layer 14d1, and thus the multi-layered sealing membrane 14b is obtained.

Through the steps described above, the display device 1 shown in FIGS. 1 to 4 can be obtained.

Second Embodiment

Figure 13:
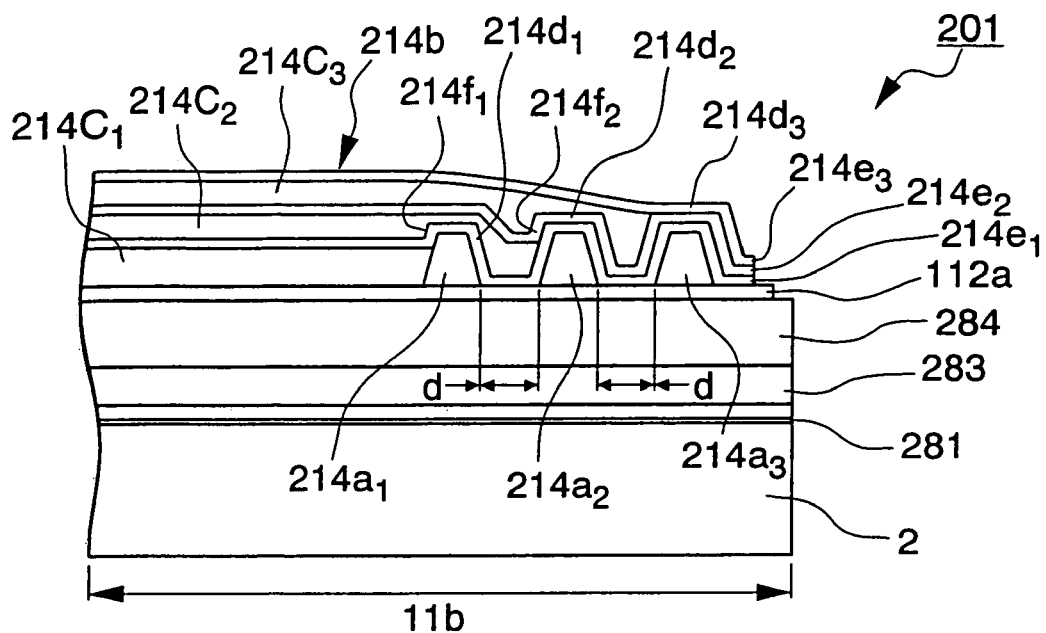
FIG. 13 is a cross-sectional view showing the major portion of a sealing structure in a display device according to a second embodiment of the present invention.

Next, a second embodiment will be explained below with reference to FIG. 13. FIG. 13 is a cross-sectional view showing the major portion of the sealing structure of a display device 201.

The elements of the display device 201 shown in FIG. 13 that are common to those of the display device I of the first embodiment shown in FIGS. 1 to 4 will be provided with the same reference symbols, and explanation therefor will be simplified or omitted.

As shown in FIG. 13, the display device 201 of the present embodiment is provided with a plurality of peripheral banks (blocking regions) 214a1, 213a2, and 214a3. The innermost peripheral bank is indicated by reference symbol 214a1, another peripheral bank indicated by reference symbol 214a2 is formed outside the peripheral bank layer 214a1, and a further peripheral bank layer 214a3 is formed outside the peripheral bank layer 214a2.

The distances "d" between the peripheral bank layer 214a1 and the peripheral bank layer 214a2, and between the peripheral bank layer 214a2 and the peripheral bank layer 214a3 are preferably set to be 10 to 300 μm. The material and thickness of each of the peripheral bank layers 214a1, 214a2, and 214a3 are substantially the same as those of the peripheral bank layer 14a in the first embodiment. The thicknesses of the peripheral bank layers 214a1, 214a2, and 214a3 may be either the same or different with respect to each other.

There is formed a multi-layered sealing membrane indicated by reference symbol 214b on the display device 201. The multi-layered sealing membrane 214b comprises three flattening resin layers 214c1, 214c2, and 214c3, and three barrier layers 214d1, 214d2, and 214d3, which are formed by depositing alternately.

The lowermost flattening resin layer 214c1, among three flattening resin layers 214c1, 214c2, and 214c3, is formed on the inorganic bank layer 112a (liquid-affinitive membrane) in the non-display section 11b and on the display element section (not shown), and is blocked by the inner surface (the left surface in FIG. 13) of the innermost peripheral bank layer 214a1. The thickness of the lowermost flattening resin layer 214c 1 is made to be less than that of the innermost peripheral bank layer 214a1. Because the surface of the inorganic bank layer 112a is made to have liquid-affinity (i.e., covered by oxide), the flattening resin layer 214c1 made of polyacrylic resin or the like is easily settled on the inorganic bank layer 112a, and thus adhesion between the inorganic bank layer 112a and the flattening resin layer 214c1 is sufficiently ensured. On the other hand, because the surface of the peripheral bank layer 214a1 is made liquid-repelling, the peripheral bank layer 214a1 does not accept the flattening resin layer 214c1, and as a result, the flattening resin layer 214c1 is reliably blocked by the peripheral bank layer 214a1. Note that a liquid-repelling treatment does not have to be applied in order to achieve the objects of the present invention.

Next, the barrier layer 214d1 is formed on the flattening resin layer 214c1. The barrier layer 214d1 is formed so as to cover three peripheral bank layers 214a1, 214a2, and 214a3, and extends over the entirety of the peripheral bank layers 214a1, 214a2, and 214a3 to the outside of the outermost peripheral bank layer 214a3 so that the edge portion 214e1 of the barrier layer 214d1 is located on the inorganic bank layer 112a. In the vicinity of the innermost peripheral bank layer 214a1, a step 214f1 is formed due to the thickness difference between the flattening resin layer 214c and the peripheral bank layer 214a1. The barrier layer 214d1 extends over the step 214f1 to the outside of the outermost peripheral bank layer 214a3.

Moreover, another flattening resin layer 214c2 is formed on the barrier layer 214d1. The flattening resin layer 214c2 is formed on the barrier layer 214d1, extends over the innermost peripheral bank layer 214a1, and is blocked by the inner surface of the adjacent peripheral bank layer 214a2. Because the barrier layer 214d1 formed in advance is made of $SiO_2$ or the like, i.e., the surface thereof is made to have liquid-affinity, the flattening resin layer 214c2 made of polyacrylic resin or the like is easily settled on the barrier layer 214d1, and as a result, the flattening resin layer 214c2 extends over the step 214f1 to reach the inner surface of the adjacent peripheral bank layer 214a2.

Next, another barrier layer 214d2 is formed on the flattening resin layer 214c2. The barrier layer 214d2 is formed so as to cover two peripheral banks 214a2 and 214a3, and extends to the outside of the outermost peripheral bank layer 214a3 so that the edge portion 214e2 of the barrier layer 214d2 is located on the inorganic bank layer 112a. In the vicinity of the peripheral bank layer 214a2, a step 214f2 is formed due to the thickness difference between the flattening resin layer 214c2 and the peripheral bank layer 214a2. The barrier layer 214d2 extends over the step 214f2 to the outside of the outermost peripheral bank layer 214a3.

Moreover, a further flattening resin layer 214c3 is formed on the barrier layer 214d2. The flattening resin layer 214c3 is formed on the barrier layer 214d2, extends over two peripheral bank layers 214a1 and 214a2, and is blocked by the inner surface of the outermost peripheral bank layer 214a3. Because the barrier layer 214d2 formed in advance is made of an oxide such as $SiO_2$ or the like, i.e., the surface thereof is made to have liquid-affinity, the flattening resin layer 214c3 made of polyacrylic resin or the like is easily settled on the barrier layer 214d2, and as a result, the flattening resin layer 214c3 extends over the steps of two peripheral bank layers 214a1 and 214a2 to reach the inner surface of the adjacent peripheral bank layer 214a3.

Next, a further barrier layer 214d3 is formed on the flattening resin layer 214c3. The barrier layer 214d3 is formed so as to cover the outermost peripheral bank layer 214a3, and extends to the outside of the outermost peripheral bank layer 214a3 so that the edge portion 214e3 of the barrier layer 214d3 is located on the inorganic bank layer 112a.

In this manner, in the display device 201 of the present embodiment, a plurality of peripheral bank layers 214a1, 214a2, and 214a3 are formed, the flattening resin layers 214c1, 214c2, and 214c3 are formed inside the peripheral bank layers 214a1, 214a2, and 214a3, respectively, and the barrier layers 214d1, 214d2, and 214d3 extend to the outside of the peripheral bank layers 214a1, 214a2, and 214a3, respectively, whereby the multi-layered sealing membrane 214b is formed.

According to the sealing structure in the display device 201 of the present embodiment, because a plurality of peripheral bank layers 214a1, 214a2, and 214a3 are formed in such a manner that the peripheral bank layers 214a2 and 214a3 are disposed outside the peripheral bank layer 214a1, the flattening resin layers 214c1, 214c2, and 214c3 can be reliably blocked even when the flattening resin layers 214c1, 214c2, and 214c3 are made thick, whereby the barrier properties of the multi-layered sealing membrane 214b can be further improved. As a result, it becomes easy to form the multi-layered sealing membrane 214b by alternately depositing the flattening resin layers 214c1, 214c2, and 214c3 and the barrier layers 214d1, 214d2, and 214d3, and thus the barrier properties against water, oxygen, or the like can be further improved.

Moreover, because each of the flattening resin layers 214c1, 214c2, and 214c3 are formed inside each of the peripheral bank layers 214a1, 214a2, and 214a3, the flattening resin layers can be reliably blocked by the blocking regions even when a plurality of flattening resin layers are employed, whereby the barrier properties of the multi-layered sealing membrane can be further improved.

Furthermore, according to the sealing structure in the display device 201 of the present embodiment, because each of the barrier layers 214d1, 214d2, and 214d3 is formed so as to extend to the outside of each of the peripheral bank layers 214a1, 214a2, and 214a3, a wide area for each of the barrier layers can be ensured, whereby adhesion between the multi-layered sealing membrane 214b and the substrate 2 and the barrier properties of the multi-layered sealing membrane 214b can be further improved, and permeation of water, oxygen, or the like into the electronic element section can be more effectively prevented.

Next, a method for fabricating the display device 201 according to the present embodiment will be explained with reference to FIGS. 14A, 14B, 15A, 15B, and 15C. The display device 201 of the present embodiment is fabricated using substantially the same method as for the display device 1 of the first embodiment. Note that because the display element section in the display device of the present embodiment is made using the same method as for the display element section 3 in the display device 1 of the first embodiment, the fabrication steps after the display element section is made will be explained hereinafter.

Figure 14A:
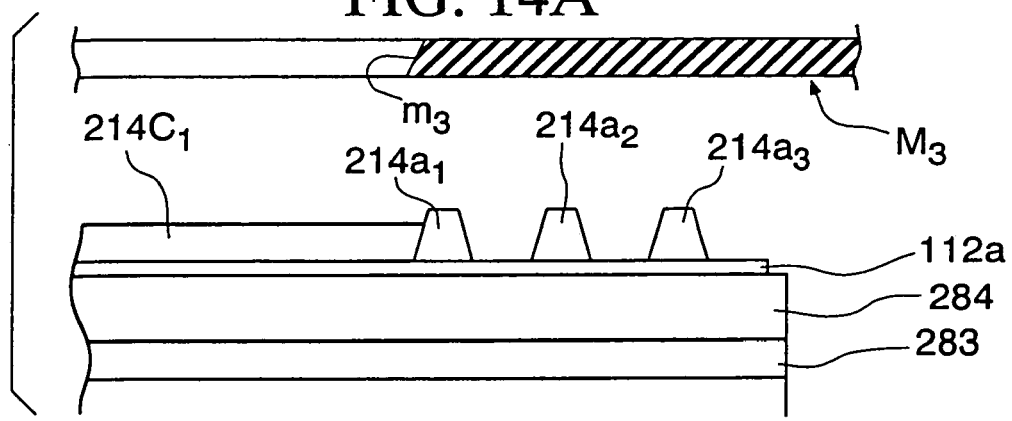
FIGS. 14A and 14B are process drawings respectively illustrating a method for fabricating the display device according to the second embodiment of the present invention.

FIG. 14A shows a state in which three peripheral bank layers 214a1, 214a2, and 214a3 are formed on the inorganic bank layer 112a. The surface of the inorganic bank layer 112a is made to have liquid-affinity, and the surfaces of the peripheral bank layers 214a1, 214a2, and 214a3 are made liquid-repelling.

As shown in FIG. 14A, as the steps for fabricating the flattening resin layer, a resin coating substance containing a resin monomer or a resin oligomer is heated and vaporized under vacuum conditions, the vaporized substance is sprayed on the inorganic bank layer 112b, which is disposed in the non-display section, and inside the peripheral bank layer 214a1, and ultraviolet light is emitted on the sprayed substance under vacuum conditions using an ultraviolet lamp, such as a mercury lamp, a metal halide lamp, or the like, so as to polymerize the resin monomer or the resin oligomer contained in the resin coating substance, and so as to form the flattening resin layer 214c. When the resin coating substance is sprayed, a mask M3 having an opening m3 is disposed above the substrate 2 while being positioned so that the opening m3 is aligned with the inside portion of the peripheral bank layer 214a formed on the substrate 2, and the resin coating substance is preferably sprayed through the opening m3. By using the mask M3, the resin coating substance is prevented from being deposited outside the peripheral bank layer 214a1. Plasma radiation may be used to polymerize the resin monomer or the resin oligomer.

The resin coating substance used in this step, which is the same as that used in the first embodiment, has substantial flowability; however, because the resin coating substance after being sprayed is blocked by the peripheral bank layer 214a1, the resin coating substance cannot flow to the outside of the peripheral bank layer 214a1. In this manner, the flattening resin layer 214c1 is formed inside the peripheral bank layer 214a1. Note that the thickness of the flattening resin layer 214c1 can be adjusted by the amount of the sprayed resin, and the thickness thereof is preferably set to be, for example, 1/3 to 2/3 of the height of the peripheral bank layer 214a1.

Figure 14B:
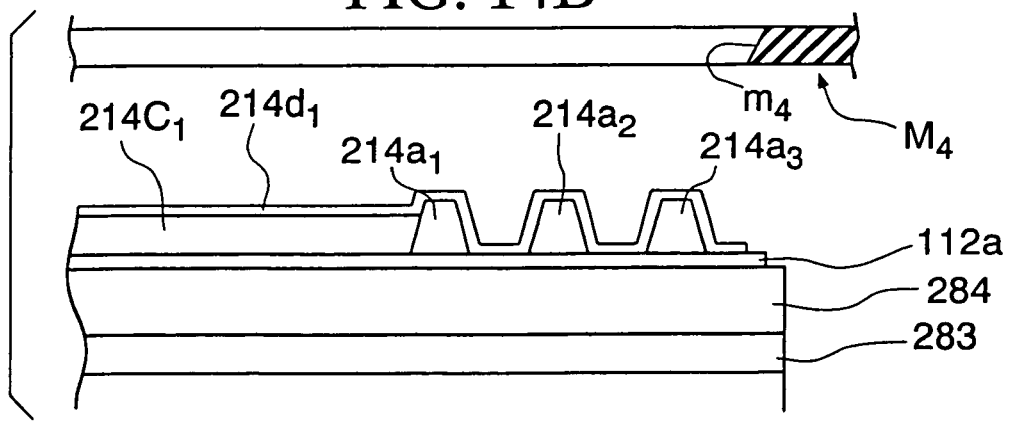

Next, as shown in FIG. 14B, as the step for fabricating the barrier layer, the barrier layer 214d1 is formed on the flattening resin layer 214c1 using a vapor deposition process. The barrier layer 214d1 may be formed using, for example, $SiO_2$, $Al_2O_3$, or the like, as a vapor deposition material. The vapor deposition process may be the same as that used in the first embodiment. When the vapor deposition process is performed, another mask M4 having an opening m4 is preferably disposed above the substrate 2 while being positioned so that the peripheral portion of the opening m4 is aligned with the outside peripheral portion of the peripheral bank layer 214a3 formed on the substrate 2, and vaporized substance is preferably applied and deposited through the opening m4. By using the mask M4, the barrier layer 214d1 is prevented from being formed on the side edges of the substrate 2. The thickness of the barrier layer 214d1 is preferably set to be 5 to 500 nm.

Figure 15A:
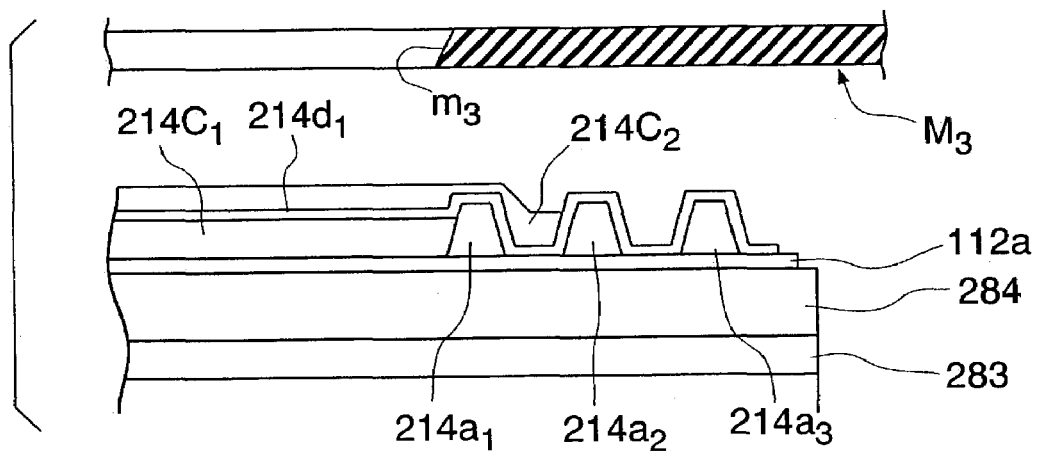
FIGS. 15A, 15B, and 15C are process drawings respectively illustrating a method for fabricating the display device according to the second embodiment of the present invention.

Next, as shown in FIG. 15A, as the steps for fabricating another flattening resin layer, the resin coating substance is heated and vaporized under vacuum conditions, the vaporized substance is sprayed on the barrier layer 214d1 formed in advance and inside the peripheral bank layers 214a1 and 214a2, and ultraviolet light is emitted on the sprayed substance under vacuum conditions using an ultraviolet lamp so as to polymerize the resin coating substance, and so as to form the flattening resin layer 214c2. When the resin coating substance is sprayed, the mask M3 is preferably disposed above the substrate 2 as in the previous step, and the resin coating substance is preferably sprayed through the opening m3. The sprayed resin coating substance flows on the barrier layer 214d1 over the peripheral bank layer 214a1, and is blocked by the peripheral bank layer 214a2; therefore, the resin coating substance cannot flow to the outside of the peripheral bank layer 214a2. In this manner, the flattening resin layer 214c2 is formed inside the peripheral bank layers 214a1 and 214a2. Note that the thickness of the flattening resin layer 214c2 can be adjusted by the amount of the sprayed resin, and the thickness thereof is preferably set to be, for example, 1/3 to 2/3 of the height of the peripheral bank layer 214a2.

Figure 15B:
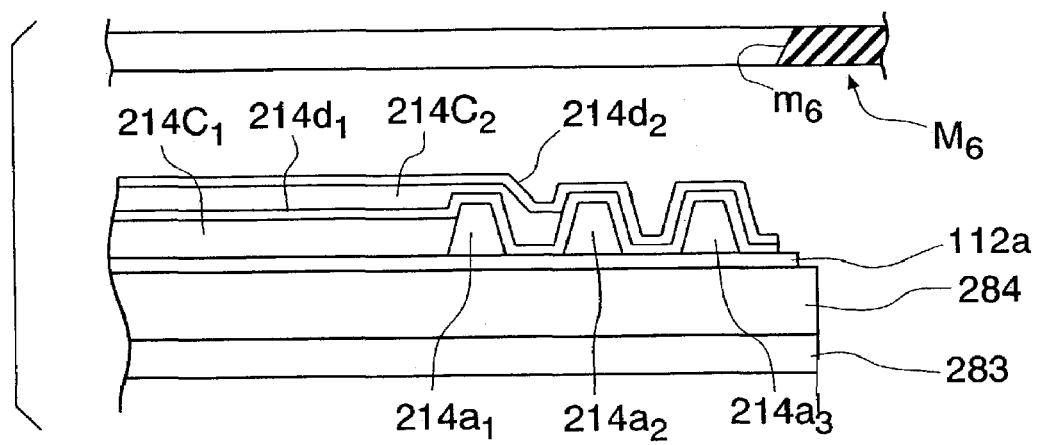

Next, as shown in FIG. 15B, as the step for fabricating another barrier layer, the barrier layer 214d2 is formed on the flattening resin layer 214c2 using a vapor deposition process. The barrier layer 214d2 may be formed using, for example, $SiO_2$, $Al_2O_3$, or the like, as a vapor deposition material. The vapor deposition process may be the same as that used in the first embodiment. When the vapor deposition process is performed, another mask M6 having an opening m6 is preferably disposed above the substrate 2 while being positioned so that the peripheral portion of the opening m6 is aligned with the outside peripheral portion of the peripheral bank layer 214a3 formed on the substrate 2, and vaporized substance is preferably applied and deposited through the opening m6. By using the mask M6, the barrier layer 214d2 is prevented from being formed on the side edges of the substrate 2. The thickness of the barrier layer 214d2 is preferably set to be 5 to 500 nm.

Figure 15C:
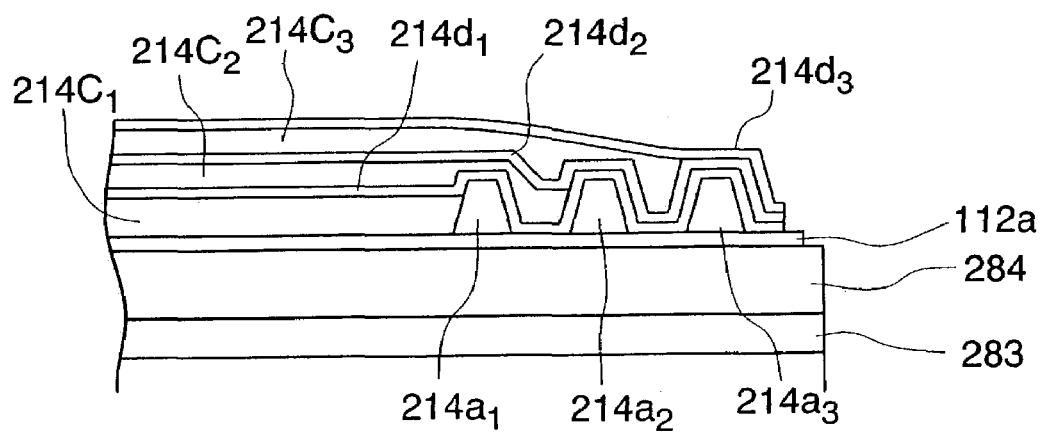

Next, as shown in FIG. 15C, by repeating the above-mentioned flattening resin layer forming step and the barrier layer forming step, the flattening resin layers 214c3 and the barrier layer 214d3 are sequentially formed on the barrier layer 214d2, and thus the multi-layered sealing membrane 214b is obtained. When the resin coating substance is sprayed for forming the flattening resin layers 214c3, the mask M3 is preferably disposed above the substrate 2 as in the previous step. The sprayed resin coating substance flows on the barrier layer 214d2 over the peripheral bank layers 214a1 and 214a2, and is blocked by the peripheral bank layer 214a3; therefore, the resin coating substance cannot flow to the outside of the peripheral bank layer 214a3.

Moreover, when the vapor deposition process is performed for forming the barrier layer 213d3, the mask M6 having the opening m6 is preferably disposed above the substrate 2 while being positioned so that the peripheral portion of the opening m6 of the mask M6 is aligned with the outside peripheral portion of the outermost peripheral bank layer 214a3 formed on the substrate 2, and vaporized substance is preferably applied and deposited through the opening. The vapor deposition process is performed in this manner, whereby the barrier layer 214d3 is prevented from being formed on the side edges of the substrate 2.

Through the steps explained above, the display device 201 shown in FIG. 3 is obtained.

Because the flattening resin layers 214c1, 214c2, and 214c3 are provided, the barrier layers 214d1, 214d2, and 214d3 can be substantially made flat, and as a result, the barrier layers 214d1, 214d2, and 214d3 can be formed without containing defects such as cracking, pin holes, or the like.

Moreover, because the barrier layers 214d1, 214d2, and 214d3 are formed on the flattening resin layers 214c1, 214c2, and 214c3, adhesions between the flattening resin layers 214c1, 214c2, and 214c3 and the barrier layers 214d1, 214d2, and 214d3 are improved due to anchor effects of the flattening resin layers 214c 1, 214c2, and 214c3, and the barrier properties against water and oxygen can be improved.

Third Embodiment

Figure 16:
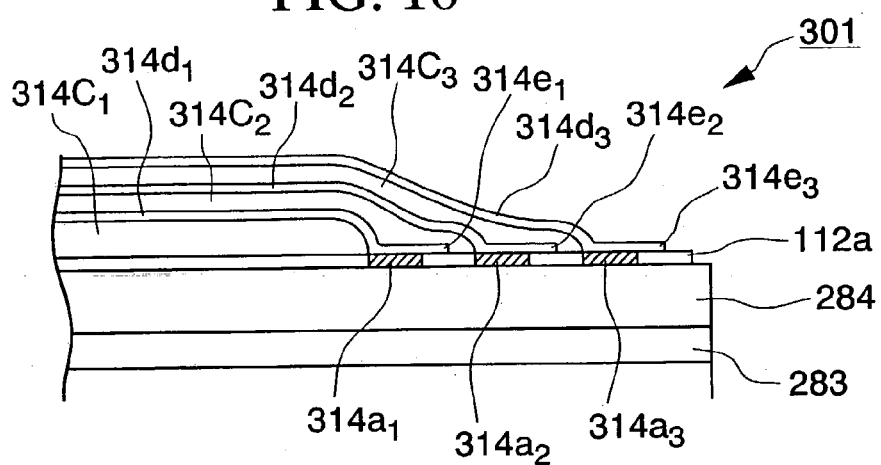
FIG. 16 is a cross-sectional view showing the major portion of a sealing structure in a display device according to a third embodiment of the present invention.

Next, a third embodiment will be explained below with reference to FIG. 16. FIG. 16 is a cross-sectional view showing the major portion of the sealing structure of a display device 301.

The elements of the display device 301 shown in FIG. 16 that are common to those of the display device 1 of the first embodiment shown in FIGS. 1 to 4 will be provided with the same reference symbols, and explanation therefor will be simplified or omitted.

As shown in FIG. 16, in the display device 301 of the present embodiment, there are formed a plurality of liquid-repelling regions (blocking regions) 314a1, 314a2, and 3l4a3 on the peripheral area of the inorganic bank layer 112a (of the substrate 2). More specifically, the innermost liquid-repelling region is indicated by reference symbol 314a1, another liquid-repelling region indicated by reference symbol 314a2 is formed outside the liquid-repelling region 314a1, and a further liquid-repelling region 314a3 is formed outside the liquid-repelling region 314a2. The distances "d" between the liquid-repelling region 314a1 and the liquid-repelling region 314a2, and between the liquid-repelling region 314a2 and the liquid-repelling region 314a3 are preferably set to be 30 to 400 μm.

The liquid-repelling regions 314a1, 314a2, and 314a3 are made by infiltrating liquid-repelling group such as a fluoro group into the surface of the inorganic bank layer 112a by a plasma treatment using tetrafluoromethane as a reaction gas, as in the case of the organic bank layer 112b of the first embodiment. As a result, the liquid-repelling regions 314a1, 314a2, and 314a3 function to repel the resin coating substance, which forms the flattening resin layer, and to block the flattening resin layer, as the peripheral bank layers 14a, 214a1, etc., in the first and second embodiments.

Moreover, in this display device, there is formed a multi-layered sealing membrane indicated by reference symbol 314b. The multi-layered sealing membrane 314b is formed by alternately depositing three flattening resin layers 314c1, 314c2, and 314c3 and three barrier layers 314d1, 314b2, and 314b3.

The lowermost flattening resin layer 314c1, among three flattening resin layers 314c1, 314c2, and 314c3, is formed on the inorganic bank layer 112a (liquid-affinitive membrane) in the non-display section 11b and on the display element section (not shown), and is blocked by the inner side (the left side in FIG. 13) of the innermost liquid-repelling region 314a1. Because the surface of the inorganic bank layer 112a is made to have liquid-affinity, the flattening resin layer 314c1 made of polyacrylic resin or the like is easily settled on the inorganic bank layer 112a, and thus adhesion between the inorganic bank layer 112a and the flattening resin layer 314c1 is sufficiently ensured. On the other hand, because the surface of the inorganic bank layer 112a in the liquid-repelling region 314a is made liquid-repelling, the liquid-repelling region 314a1 does not accept the flattening resin layer 314c1, and as a result, the flattening resin layer 314c1 is blocked by the liquid-repelling region 314a1.

Next, the barrier layer 314d1 is formed on the flattening resin layer 314c1. The barrier layer 314d1 is formed so as to cover the liquid-repelling region 314a1, and extends over the liquid-repelling region 314a1 to the outside of the liquid-repelling region 314a1 so that the edge portion 314e1 of the barrier layer 314d1 is located on the inorganic bank layer 112a. In the vicinity of the innermost liquid-repelling region 314a1, the flattening resin layer 314c1 is blocked by the liquid-repelling region 314a1. The barrier layer 314d1 extends over the flattening resin layer 314c1 to reach the outside of the liquid-repelling region 314a1.

Moreover, another flattening resin layer 314c2 is formed on the barrier layer 314d1. The flattening resin layer 314c2 is formed on the barrier layer 314d1, extends over the innermost liquid-repelling region 314a1, and is blocked by the inner side of the adjacent liquid-repelling region 314a2. Because the barrier layer 314d1 formed in advance is made of SiO$_2$ or the like, i.e., the surface thereof is made to have liquid-affinity, and because the innermost liquid-repelling region 314a1 is covered by the barrier layer 314d1, the flattening resin layer 314c2 made of polyacrylic resin or the like is easily settled on the barrier layer 314d1, and the flattening resin layer 314c2 extends over liquid-repelling region 314a1 to reach the inner side of the adjacent liquid-repelling region 314a2.

Next, another barrier layer 314d2 is formed on the flattening resin layer 314c2. The barrier layer 314d2 is formed so as to cover the liquid-repelling region 314a2, and extends over the liquid-repelling region 314a1 to the outside of the liquid-repelling region 314a2 so that the edge portion 314e2 of the barrier layer 314d2 is located on the inorganic bank layer 112a. In the vicinity of the liquid-repelling region 314a2, the flattening resin layer 314c2 is blocked by the liquid-repelling region 314a2. The barrier layer 314d2 extends over the flattening resin layer 314c2 to reach the outside of the liquid-repelling region 314a2.

Moreover, a further flattening resin layer 314c3 is formed on the barrier layer 314d2. The flattening resin layer 314c3 is formed on the barrier layer 314d2, extends over the liquid-repelling regions 314a1 and 314a2, and is blocked by the inner surface of the outermost liquid-repelling region 314a3. Because the barrier layer 314d2 formed in advance is made of SiO$_2$ or the like, i.e., the surface thereof is made to have liquid-affinity, and because the innermost liquid-repelling region 314a2 is covered by the barrier layer 314d2, the flattening resin layer 314c3 made of polyacrylic resin or the like is easily settled on the barrier layer 314d2, and the flattening resin layer 314c3 extends over liquid-repelling region 314a2 to reach the inner side of the adjacent liquid-repelling region 314a3.

Next, a further barrier layer 314d3 is formed on the flattening resin layer 314c3. The barrier layer 314d3 is formed so as to cover the outermost liquid-repelling region 314a3, and extends to the outside of the outermost liquid-repelling region 314a3 so that the edge portion 314e3 of the barrier layer 314d3 is located on the inorganic bank layer 112a.

In this manner, in the display device 201 of the present embodiment, a plurality of liquid-repelling regions 314a1, 314a2, and 314a3 are formed, the flattening resin layers 314c1, 314c2, and 314c3 are formed inside the liquid-repelling regions 314a1, 314a2, and 314a3, respectively, and the barrier layers 314d1, 314d2, and 314d3 extend to the outside of the liquid-repelling regions 314a1, 314a2, and 314a3, respectively, whereby the multi-layered sealing membrane 314b is formed.

According to the sealing structure in the display device 301 of the present embodiment, because a plurality of liquid-repelling regions 314a1, 314a2, and 314a3 are formed in such a manner that the liquid-repelling regions 314a2 and 314a3 are disposed outside the liquid-repelling region 314a1, the area where the barrier layers 314d1, 314d2, and 314d3 are formed can be increased, whereby the barrier properties of the multi-layered sealing membrane 314b can be further improved, and permeation of water, oxygen, or the like into the display element section 3 can be more effectively prevented. In particular, because the multi-layered sealing membrane 314b is formed by alternately depositing the flattening resin layers 314c1, 314c2, and 314c3 and the barrier layers 314d1, 314d2, and 314d3, the barrier properties against water, oxygen, or the like can be further improved.

Moreover, because each of the flattening resin layers 314c1, 314c2, and 314c3 are formed inside each of the liquid-repelling regions 314a1, 314a2, and 314a3, the barrier properties against water, oxygen, or the like can be further improved, even when a plurality of flattening resin layers and barrier layers are employed in an alternately deposited manner.

Furthermore, according to the sealing structure in the display device 301 of the present embodiment, a plurality of barrier layers 314d1, 314d2, and 314d3 are formed so as to extend to the outside of the liquid-repelling regions 314a1, 314a2, and 314a3, respectively, and the multi-layered sealing membrane 314b is formed by alternately depositing the flattening resin layers 314c1, 314c2, and 314c3 and the barrier layers 314d1, 314d2, and 314d3; therefore, the barrier properties against water, oxygen, or the like can be further improved.

In addition, because each of the liquid-repelling regions 314a1, 314a2, and 314a3 is formed in a loop-shape, the flattening resin layers 314c1, 314c2, and 314c3 are held inside the liquid-repelling regions 314a1, 314a2, and 314a3, respectively; therefore, variation of the barrier properties depending on location can be reduced, and thus reliability of sealing can be improved.

The display device 301 of the present embodiment is fabricated in a manner similar to that for the display device 201 of the second embodiment except that the liquid-repelling regions 314a1, 314a2, and 314a3 are provided on the peripheral portion of the inorganic bank layer using a plasma treatment, instead of providing the peripheral bank layers. Note that the plasma treatment for the inorganic bank layer 112a and the $CF_4$ plasma treatment for the organic bank layer may be performed simultaneously.

Fourth Embodiment

Next, a fourth embodiment will be explained below with reference to FIGS. 17 to 19. FIG. 13 is a schematic plan view showing a display device 401 of the present embodiment, FIG. 18 is a cross-sectional view taken along the line A–A' in FIG. 17, and FIG. 19 is a cross-sectional view taken along the line B–B' in FIG. 17.

Figure 17:
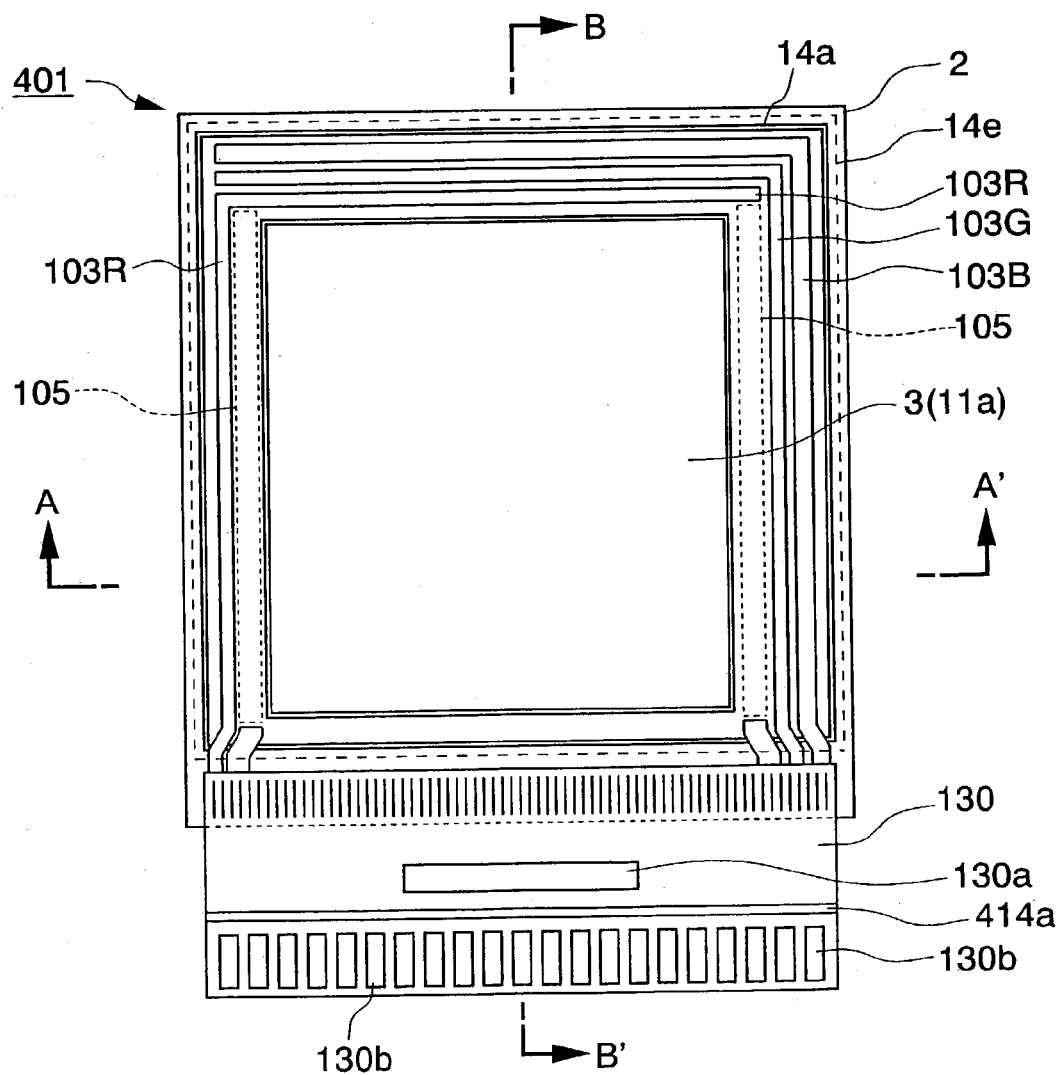
FIG. 17 is a schematic plan view showing a display device according to a fourth embodiment of the present invention.
Figure 18:
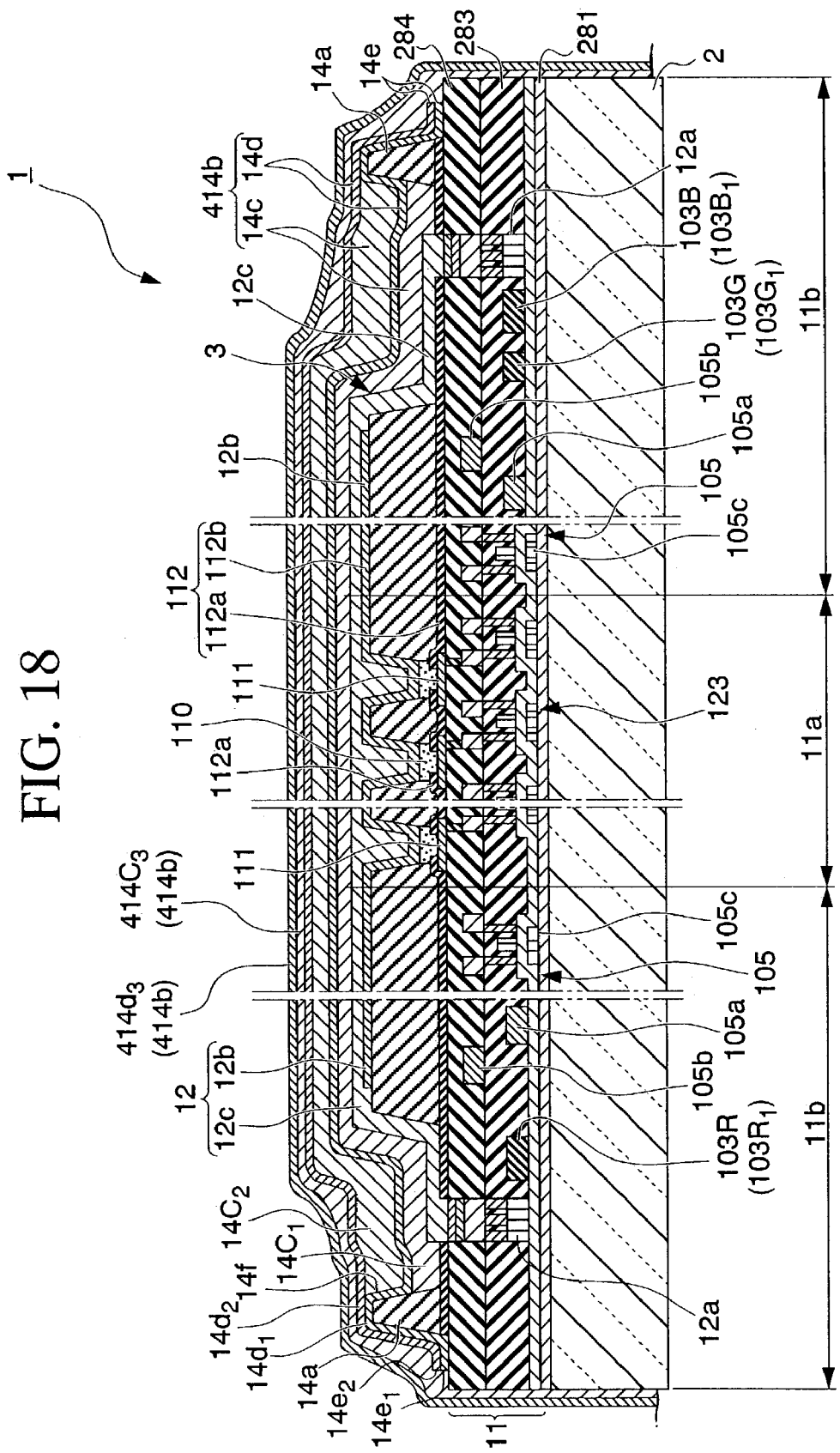
FIG. 18 is a cross-sectional view taken along the line A–A' in FIG. 17.
Figure 19:
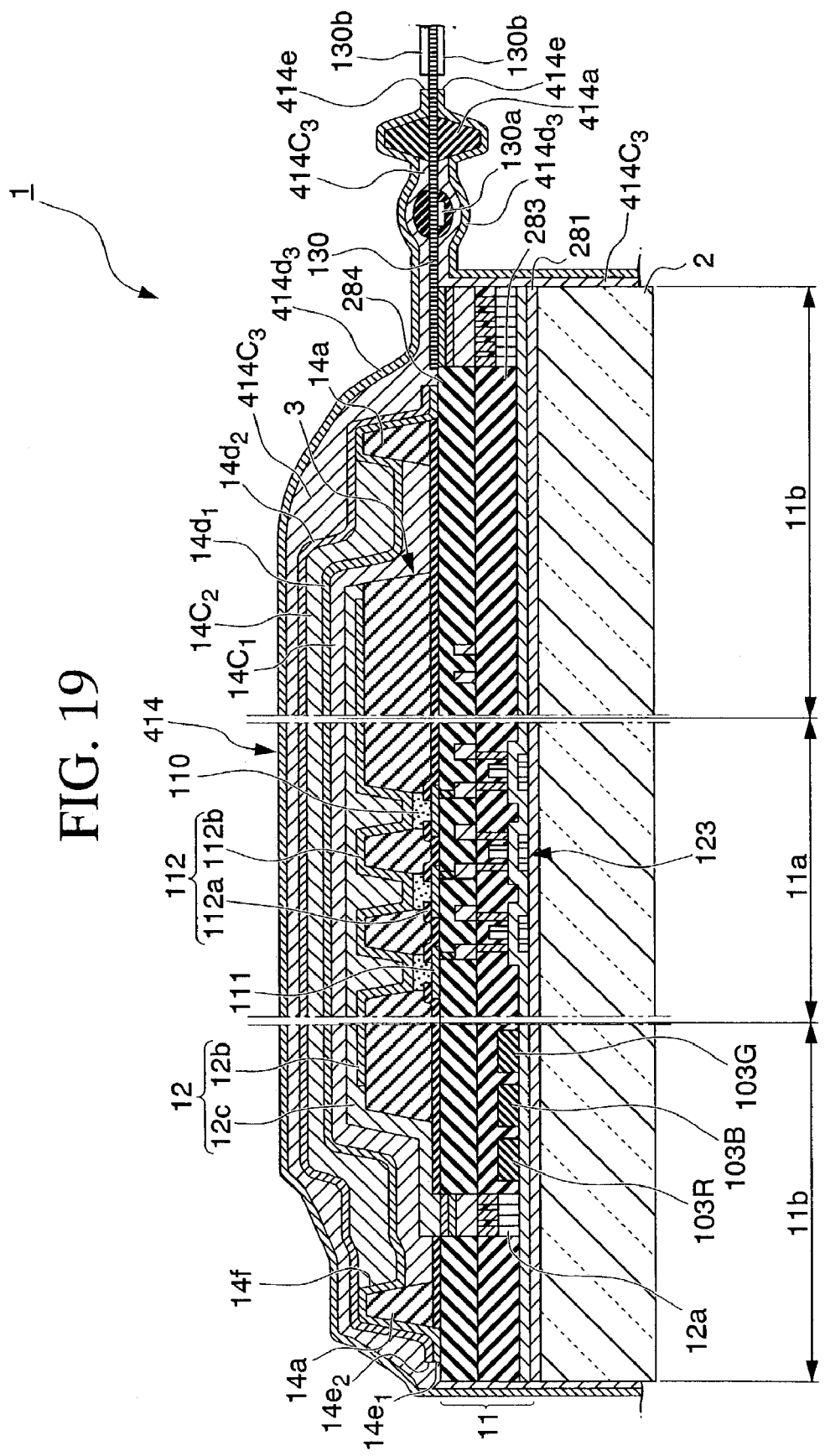
FIG. 19 is a cross-sectional view taken along the line B–B' in FIG. 17.

The elements of the display device 401 shown in FIGS. 17 to 19 that are common to those of the display device 1 of the first embodiment shown in FIGS. 1 to 4 will be provided with the same reference symbols, and explanation therefor will be simplified or omitted.

As shown in FIGS. 17 to 19, in the display device 401, the closed-loop peripheral bank layer 14a (blocking region) is formed around the display element section 3 disposed on the substrate 2. Moreover, blocking bank layers 414a (another blocking region) are formed on a flexible tape 130 which is adhered to an end of the substrate 2. As shown in FIGS. 17 and 19, the blocking bank layers 414a are formed on both sides of the flexible tape 130, respectively, while being disposed between a control IC 130a and external terminals 130b.

Moreover, a multi-layered sealing membrane 414b is formed on the display element section 3. The multi-layered sealing membrane 414b is formed by alternately depositing three flattening resin layers 14c1, 14c2, and 414c3 and three barrier layers 14d1, 14b2, and 414b3. Two flattening resin layers 14c1, 14c2, among three flattening resin layers, are formed inside the closed-loop peripheral bank layer 14a, i.e., are blocked by the closed-loop peripheral bank layer 14a. Two barrier layers 14d1 and 14b2, among three barrier layers, are formed on the flattening resin layers 14c1 and 14c2, respectively (i.e., inside the peripheral bank layer 14a), and the edge portions 14e (i.e., 14e1 and 14e2) thereof extend over the peripheral bank layer 14a.

The remaining flattening resin layers 414c3 is formed so as to cover the substrate 2, the barrier layer 14d2, a portion of the flexible tape 130, and the control IC 130a, and so as to be disposed in an area closer to the substrate 2 than from the blocking bank layers 414a. The flattening resin layer 414c3 is blocked by the blocking bank layers 414a so as not to contact the external terminals 130b.

Practically, the flattening resin layer 414c3 extends to the bottom surface of the substrate 2, which is not shown in FIGS. 18 and 19.

Moreover, the remaining barrier layer 414d3 is formed on the flattening resin layer 414c3, and the edge portion 414e3 thereof extends over the blocking bank layer 414a.

The thickness of the blocking bank layer 414a is preferably set to be 2 to 500 μm. The surface of the blocking bank layer 414a is preferably made liquid-repelling as in the case of the organic bank layer 112b or the peripheral bank layer 14a.

The flattening resin layer 414c3 is made of polyacrylic resin or the like as the other flattening resin layers 14c1 and 14c2 to protect the connecting region between the flexible tape 130 and the substrate 2, and the control IC 130a. In addition, the flattening resin layer 414c3 acts to reduce the step coverage of the barrier layer 414d3 formed thereon so as to prevent pin holes and cracking from occurring in the barrier layer 414d3. The barrier layer 414d3 consists of an inorganic membrane such as $SiO_2$ or the like as the other barrier layers 14d1 and 14d2 so as to be superior in blocking water or oxygen. The multi-layered sealing membrane 414b is formed by alternately depositing the flattening resin layers 14c1, 14c2, and 414c3 and the barrier layers 14d1, 14b2, and 414b3 in order to protect the display element section 3, the connecting region between the flexible tape 130 and the substrate 2, and the control IC 130a from permeation of water or oxygen.

The sealing structure will be described more specifically. As shown in FIGS. 18 and 19, the flattening resin layer 414c3 is formed on the barrier layer 14d2, on the substrate 2, on both sides of the flexible tape 130, and on the control IC 130a, and is blocked by the blocking bank layer 414a. In other words, the thickness of the flattening resin layer 414c3 is set to be equal to or less than that of the blocking bank layer 414a.

The barrier layer 414d3 is deposited on the flattening resin layer 414c3. The barrier layer 414d3 is formed so as to cover the blocking bank layer 414a, and extends over the blocking bank layer 414a to a position adjacent to the external terminal 130b.

The blocking bank layer 414a is made of a resist having thermal resistance and solvent resistance, such as acrylic resin, polyimide resin, or the like, as mentioned above, The thickness of the blocking bank layer 414a is preferably set to be 2 to 600 μm. The thickness of the blocking bank layer 414a depends on the thickness of layers such as the resist for forming the flexible tape, patterned wirings, markings, or the like when such layers are also used as the blocking bank layer 414a. Alternatively, the blocking bank layer 414a may be formed so as to have a predetermined thickness using an ink-jet method.

The flattening resin layer 414c3 is made of acrylic resin or the like. The thickness of the flattening resin layer 414c3 is preferably set to be 0.1 to 10 μm. The thickness of the flattening resin layer 414c3 is preferably adjusted depending on the irregularities on the flexible tape.

The barrier layer 414d3 is made of metal such as aluminum, titanium, or the like, or oxide such as $SiO_2$, $Al_2O_3$, or the like. The thickness of the barrier layer 414d3 is preferably set to be 10 to 1000 nm. The thickness of the barrier layer 414d3 is preferably adjusted depending on use, or required barrier properties.

By employing such a sealing structure, the entire drive circuit including the drive IC 130a is encapsulated by the flattening resin layer 414c3 and the barrier layer 414d3; therefore, permeation of water or oxygen into the connecting portion between the drive circuit and the display section, which is susceptible to humidity, can be prevented, and reliability of the overall display device can be further improved.

Fifth Embodiment

Next, specific examples of electronic apparatus comprising one of the display devices according to the first to fourth embodiments will be explained below.

Figure 20A:
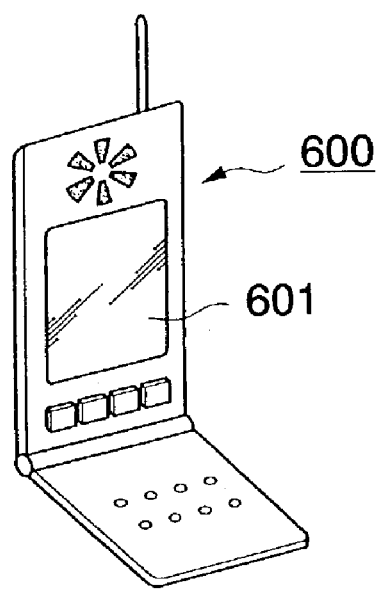
FIGS. 20A, 20B, and 20C are perspective views respectively showing electronic apparatuses according to a fifth embodiment of the present invention.

FIG. 20A is a perspective view of an example of a portable telephone or a remote controller. In FIG. 20A, reference symbol 600 indicates a body of the portable telephone and reference symbol 601 indicates a display portion comprising any one of the display devices 1, 201, 301, and 401 described above.

Figure 20B:
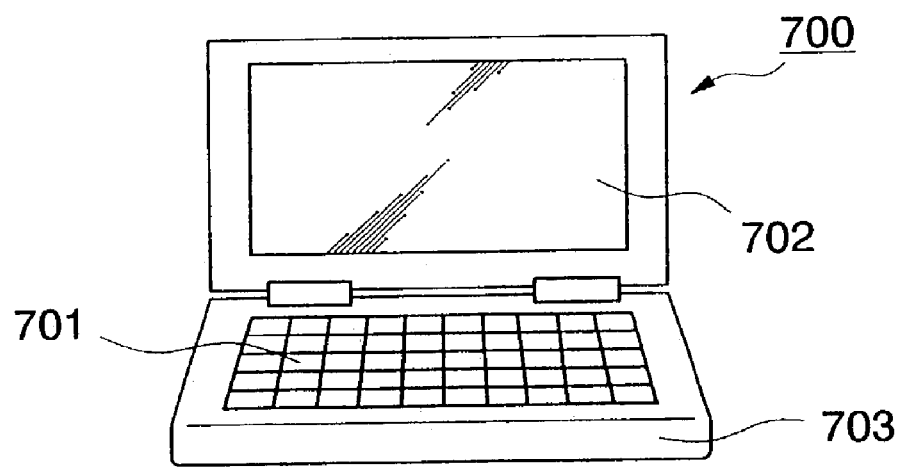

FIG. 20B is a perspective view of an example of a portable information processor such as a PDA or a personal computer. In FIG. 20B, reference symbol 700 indicates an information processor, reference symbol 701 indicates an input device such as a keyboard, reference symbol 703 indicates a body of the information processor, and reference symbol 702 indicates a display portion comprising any one of the display devices 1, 201, 301, and 401 described above.

Figure 20C:
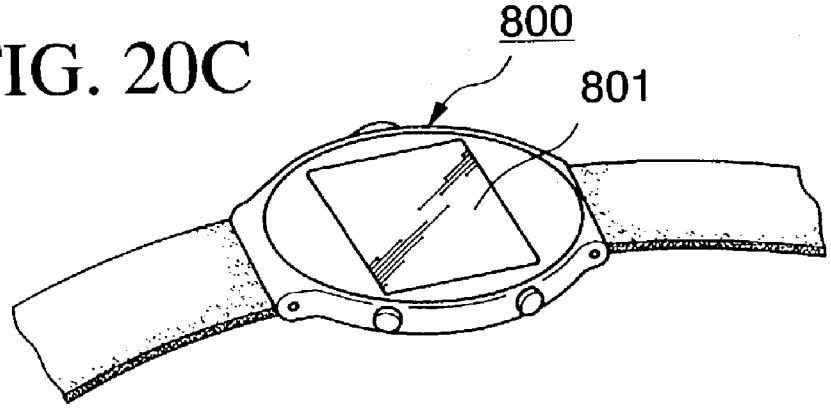

FIG. 20C is a perspective view of an example of a watch. In FIG. 20C, reference symbol 800 indicates a body of the watch and reference symbol 801 indicates a display portion comprising any one of the display devices 1, 201, 301, and 401 described above.

Each of the electronic apparatuses shown in FIGS. 20A to 20C includes a display portion comprising any one of the display devices 1, 201, 301, and 401 described above, and thus has the same advantages as that of the display devices according to the first to fifth embodiments; therefore, these electronic apparatuses will exhibit an excellent display performance while being thin.

The electronic apparatus may be fabricated through the steps of fabricating, in a manner similar to that for the first to fifth embodiments, one the display devices 1, 201, 301, and 401 including the drive IC 130a shown in FIG. 2, incorporating one of the display devices 1, 201, 301, and 401 into an electronic apparatus such as a portable telephone, an information processor, or watch.

The present invention is not limited to the embodiments explained above, and various modifications may be made without departing from the scope of the present invention.

Figure 21:
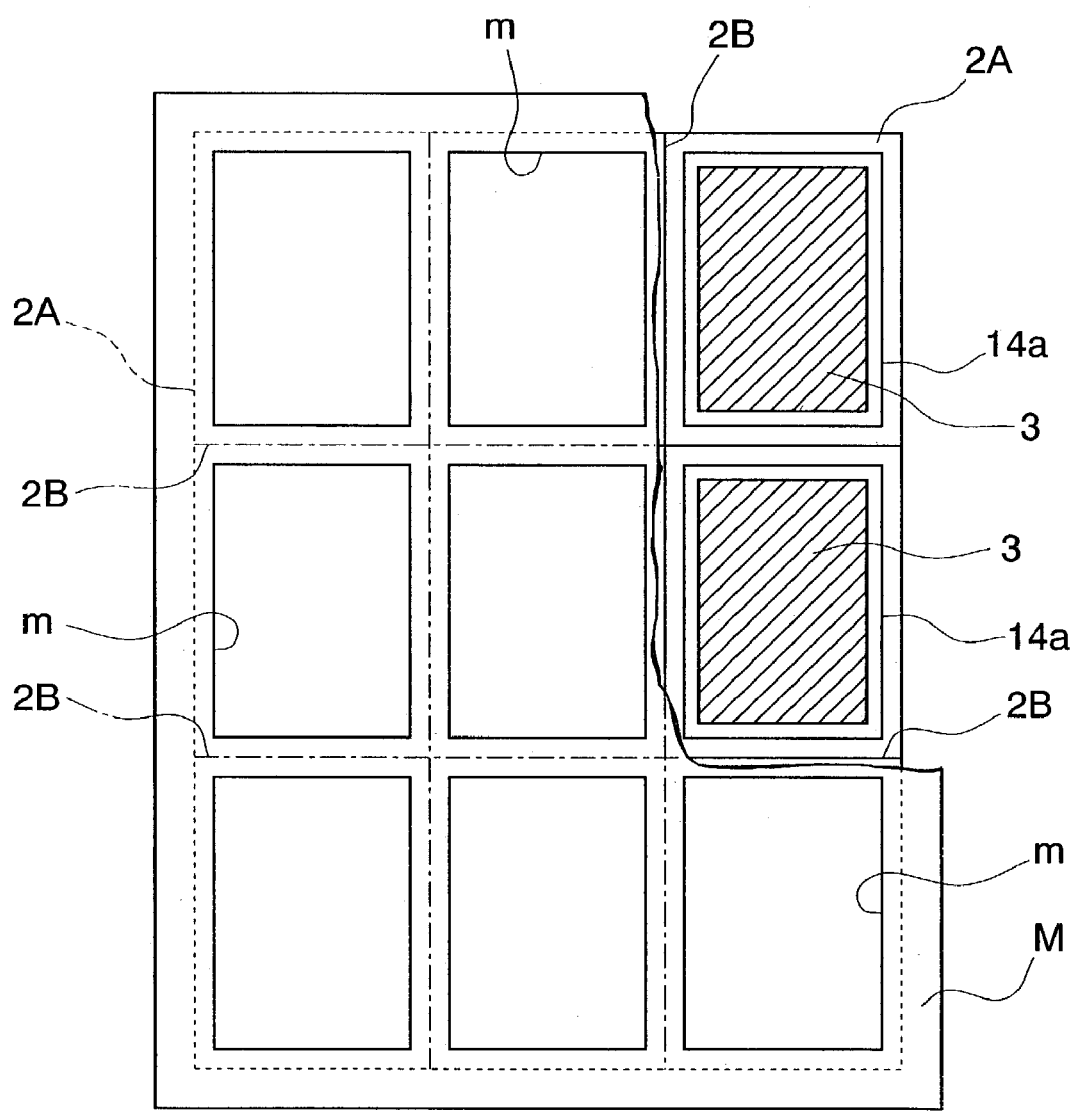
FIG. 21 is a plan view showing a positional relationship between a mask, which is used when resin coating substance is applied, and a mother substrate.

For example, the display devices of the present invention may be made in such a manner that a plurality of display element sections 3 are formed on a mother substrate 2A, and the mother substrate 2A is divided into the display element sections 3, whereby a number of display devices can be obtained at a time. In this case, as shown in FIG. 21, a mask M having a plurality of openings "m" corresponding to the display element sections 3 may preferably be used when a resin coating substance is sprayed. The openings "m" of the mask M are formed so as not to expose cutting lines 2B drawn on the mother substrate 2A for each of the display devices. As a result, the flattening resin layers and barrier layers are not formed on the cutting lines 2B; therefore, the flattening resin layers may not be separated when the mother substrate 2A is cut.

In the above description, the blocking regions and the organic bank layers are made of the same material and are formed in the same fabrication step; however, in the case of passive organic EL devices, a resist or a marking on a cathode separator or a circuit board corresponds to the blocking region, and such elements which have a blocking function, and which are formed in existing fabrication steps, may preferably be used as the blocking regions.

INDUSTRIAL APPLICABILITY

As explained above in detail, according to the sealing structure in the display device of the present invention, specific sections including the display element sections can be selectively and reliably sealed by the multi-layered sealing structure formed by depositing the flattening resin layers and barrier layers, and the multi-layered sealing structure can be made thinner than a "sealing can" in a conventional sealing structure even when sealing areas are large; therefore, the overall thickness of the display device can be greatly reduced from conventional display devices.

In addition, the positions of the edges of the multi-layered sealing structure, which is formed by the flattening resin layer and the barrier layer that is free from pin holes, cracking, and thickness variation due to the flattening resin layer, can be accurately defined by the blocking regions. Moreover, adhesion of the edges of the multi-layered sealing structure is improved by ensuring a large contact area between the substrate whose surface is made to have liquid-affinity and the multi-layered sealing structure, the permeation passes against water, oxygen, impurity ions, or the like can be made long due to irregularities of the blocking region; therefore, excellent barrier properties and reliability of the sealing structure can be maintained in a long period even when the blocking region is narrow.

As a result, the frame region of an organic EL display device or of a LCD can be made narrower than that of a conventional display device, while decreasing the thickness and weight of the display device, whereby electronic apparatuses can be obtained in which freedom of exterior design is enhanced and spaces are effectively utilized. In addition, because unusable area due to the frame region is decreased, the number of display devices that are obtainable from a mother substrate may be increased, and productivity may be improved.

Furthermore, the sealing structure can be broadly applicable to an electronic apparatus, electrical apparatus, a module, and components such as a circuit board having a number of elements, an electron-optical module, an IC card, or the like, as a sealing means which has an integral structure and flexibility, and which is thin and lightweight.

What is claimed is:

1. A sealing structure for an electronic element, comprising:
   a first blocking region surrounding at least a portion of the electronic element;
   a first flattening resin layer that is formed above a base member and that is delineated by the first blocking region formed on the base member;
   a first barrier layer extending beyond the first flattening resin layer to cover a side of the first flattening resin layer and the first blocking region;
   a second flattening resin layer disposed over the first barrier layer; and
   a second barrier layer covering the second flattening resin layer and the first blocking region, wherein
   the first barrier layer contacts the second barrier layer at an outside of the first blocking region.

2. A sealing structure for an electronic element according to claim 1, wherein the base member comprises an inorganic insulating layer on which the first blocking region is formed.

3. A sealing structure for an electronic element according to claim 2, wherein the inorganic insulating layer contacts both the first barrier layer and the second barrier layer.

4. A sealing structure for an electronic element according to claim 1, further comprising a second blocking region disposed outside the first blocking region and delineating the second flattening resin layer.

5. A sealing structure for an electronic element according to claim 4,
wherein the first barrier layer is extended to cover the outside of the first blocking region, and
wherein the second barrier is extended to cover an outside of the second blocking region.

6. A sealing structure for an electronic element according to claim 1, wherein a protruding member made of organic material is disposed at the first blocking region.

7. A sealing structure for an electronic element according to claim 1, wherein a member including a liquid repelling group is disposed at the first blocking region.

8. A sealing structure for an electronic element according to claim 1,
wherein each of edge portions of the first flattening resin layer and the second flattening resin layer has a slope, and
wherein the slope of the second flattening resin layer is more gentle than the slope of the first flattening resin layer.

9. A display device comprising the sealing structure for an electronic element according to claim 1, wherein the electronic element comprises a display element.

10. A display device according to claim 9, wherein the display element comprises a plurality of light emitting elements.

11. A display device according to claim 10,
wherein the light emitting elements are delimited by banks being made of organic membranes, and
wherein the banks are disposed at the first blocking region.

12. An electronic apparatus comprising the display device according to claim 10.

13. A sealing structure for an electronic element, comprising:
an inorganic insulating layer formed above a base member;
a first flattening resin layer disposed over the inorganic insulating layer and the electronic element;
a first barrier layer disposed over the first flattening resin layer;
a second flattening resin layer disposed over the first barrier layer; and
a second barrier layer disposed over the second flattening resin layer, wherein
the inorganic insulating layer contacts both the first barrier layer and the second barrier layer.

14. A sealing structure for an electronic element according to claim 13, wherein a region in which the inorganic insulating layer contacts the first barrier layer and the second barrier layer surrounds the electronic element.

15. A sealing structure for an electronic element according to claim 13,
wherein each of edge portions of the first flattening resin layer and the second flattening resin layer has a slope, and
wherein the slope of the second flattening resin layer is more gentle than the slope of the first flattening resin layer.

16. A display device comprising the sealing structure for an electronic element according to claim 13, wherein the electronic element comprises a display element.

17. A display device according to claim 16, wherein the display element comprises a plurality of light emitting elements.

18. An electronic apparatus comprising the display device according to claim 16.

19. A sealing structure for an electronic element, comprising:
a first flattening resin layer that is formed above an insulating layer and that comprises a first part and a second part surrounding the first part, the second part contacting the insulating layer;
a first barrier layer extending beyond the second part of the first flattening resin layer to cover an entirety of the second part of the first flattening resin layer;
a second flattening resin layer disposed over the first barrier layer; and
a second barrier layer covering the second flattening resin layer.

20. A sealing structure for an electronic element according to claim 19, wherein the first part of the first flattening resin layer covers the electronic element.

* * * * *